US011569009B2

(12) United States Patent
Porter

(10) Patent No.: US 11,569,009 B2
(45) Date of Patent: Jan. 31, 2023

(54) AUTOMATED WIRE PROCESSING SYSTEM AND METHODS

(71) Applicant: The Boeing Company, Chicago, IL (US)

(72) Inventor: John Porter, Edgewood, WA (US)

(73) Assignee: The Boeing Company, Chicago, IL (US)

( * ) Notice: Subject to any disclaimer, the term of this patent is extended or adjusted under 35 U.S.C. 154(b) by 263 days.

(21) Appl. No.: 15/380,846

(22) Filed: Dec. 15, 2016

(65) Prior Publication Data

US 2018/0174715 A1 Jun. 21, 2018

(51) Int. Cl.
| | |
|---|---|
| *H01B 13/012* | (2006.01) |
| *B23K 3/06* | (2006.01) |
| *H01B 13/00* | (2006.01) |
| *H02G 1/12* | (2006.01) |
| *H01R 43/28* | (2006.01) |
| *B23K 3/08* | (2006.01) |
| *H01B 13/34* | (2006.01) |

(Continued)

(52) U.S. Cl.
CPC ....... *H01B 13/01236* (2013.01); *B23K 3/063* (2013.01); *H01B 13/0003* (2013.01); *H01B 13/0036* (2013.01); *H02G 1/1248* (2013.01); *B21F 3/00* (2013.01); *B21F 3/04* (2013.01); *B23K 3/087* (2013.01); *G01R 31/58* (2020.01); *G01R 31/59* (2020.01); *H01B 13/06* (2013.01); *H01B 13/32* (2013.01); *H01B 13/345* (2013.01); *H01R 43/28* (2013.01); *H02G 1/08* (2013.01); *Y10T 29/49194* (2015.01); *Y10T 29/49197* (2015.01); *Y10T 29/53213* (2015.01); *Y10T 29/53217* (2015.01); *Y10T 29/53243* (2015.01)

(58) Field of Classification Search
CPC ............ H01B 13/0003; H01B 13/0036; H01B 13/01236; H01B 13/32; H01B 13/345; H01B 13/06; H02G 1/1248; H02G 1/08; H01R 43/28; B21F 3/00; B21F 3/04; Y10T 29/49194; Y10T 29/49197; Y10T 29/53213; Y10T 29/53243; Y10T 29/53217; G01R 31/58; G01R 31/59
See application file for complete search history.

(56) References Cited

U.S. PATENT DOCUMENTS

| 329,053 A | 10/1885 | Kizer et al. |
|---|---|---|
| 1,726,279 A | 8/1929 | Werner |

(Continued)

FOREIGN PATENT DOCUMENTS

| CN | 1225401 | 8/1999 |
|---|---|---|
| CN | 101472818 | 7/2009 |

(Continued)

OTHER PUBLICATIONS

Machine Language Translation (English) of Japanese Patent Publication JP 62-137816, Apr. 2019.*

(Continued)

*Primary Examiner* — A. Dexter Tugbang
(74) *Attorney, Agent, or Firm* — Haynes and Boone, LLP

(57) ABSTRACT

In wire processing systems and methods, a wire channel receives a wire. One or more fluid guides flow the fluid into the wire channel to move, along the wire, a component (e.g. a solder sleeve) positioned at least partially in the wire channel and coupled to the wire. Other features are also provided.

25 Claims, 23 Drawing Sheets

(51) Int. Cl.
*H01B 13/06* (2006.01)
*H01B 13/32* (2006.01)
*B21F 3/00* (2006.01)
*B21F 3/04* (2006.01)
*H02G 1/08* (2006.01)
*G01R 31/58* (2020.01)
*G01R 31/59* (2020.01)

(56) References Cited

U.S. PATENT DOCUMENTS

| | | | |
|---|---|---|---|
| 2,360,944 A * | 10/1944 | Fruth | G01R 31/59 |
| | | | 340/647 |
| 2,943,807 A | 7/1960 | Loop | |
| 3,214,114 A | 10/1965 | Wilson | |
| 3,890,566 A * | 6/1975 | Nordblad | H01B 13/0036 |
| | | | 324/518 |
| 4,310,967 A | 1/1982 | Funcik et al. | |
| 4,370,786 A | 2/1983 | Butler | |
| 4,678,533 A | 7/1987 | Bartlett et al. | |
| 5,228,918 A * | 7/1993 | Garand | H01B 13/345 |
| | | | 118/67 |
| 5,353,699 A * | 10/1994 | Tamura | H01B 13/345 |
| | | | 101/35 |
| 5,511,307 A * | 4/1996 | Reiersgaard | Y10T 29/53213 |
| | | | 29/748 |
| 5,603,469 A | 2/1997 | Stocchi | |
| 5,762,321 A * | 6/1998 | Petersen | H02G 1/08 |
| | | | 254/134.4 |
| 5,813,658 A | 9/1998 | Mitchell et al. | |
| 6,047,453 A * | 4/2000 | Matsudome | B21F 3/04 |
| | | | 242/443 |
| 6,402,123 B1 | 6/2002 | Rivard | |
| 6,533,205 B1 | 3/2003 | Kles | |
| 7,740,199 B2 | 6/2010 | Aikoh et al. | |
| 2007/0101570 A1 | 5/2007 | Conte | |
| 2008/0134968 A1* | 6/2008 | Kamata | H01B 13/345 |
| | | | 118/314 |
| 2008/0271510 A1 | 11/2008 | Estermann et al. | |
| 2013/0056110 A1 | 3/2013 | Yamaguchi et al. | |
| 2016/0090247 A1 | 3/2016 | Kaminski et al. | |
| 2018/0174712 A1 | 6/2018 | Porter | |
| 2018/0174714 A1 | 6/2018 | Porter | |
| 2018/0174715 A1 | 6/2018 | Porter | |

FOREIGN PATENT DOCUMENTS

| | | |
|---|---|---|
| CN | 202571106 | 12/2012 |
| CN | 104550580 | 4/2015 |
| CN | 105026626 | 11/2015 |
| DE | 837382 | 4/1952 |
| DE | 1173760 | 7/1964 |
| DE | 3934401 | 4/1991 |
| DE | 4021744 | 1/1992 |
| DE | 102017125039 | 8/2018 |
| EP | 3021430 | 5/2016 |
| EP | 3021438 | 5/2016 |
| GB | 2049500 | 12/1980 |
| JP | 62-137816 | 6/1987 |
| JP | H02-75181 | 3/1990 |
| JP | 06/127842 | 5/1994 |
| JP | 2001-2242 | 1/2001 |
| JP | 2002-313516 | 10/2002 |
| JP | 2004-227863 | 8/2004 |
| JP | 2004220977 | 8/2004 |
| JP | 2007-35523 | 2/2007 |
| JP | 2012039703 A * | 2/2012 |
| JP | 2014235908 | 12/2014 |
| WO | WO 2004/021368 | 3/2004 |

OTHER PUBLICATIONS

Cheers Electronic Technical Co., Ltd, "best striping and wirecutting machine CSC-515F2", Aug. 18, 2016, 4 pages [online], [retrieved on Feb. 6, 2017]. Retrieved from the Internet: <URL:http://www.wirecuttermachine.com/Others/best-striping-and-wirecutting-machine-CSC-515F2.htm>.

Cheers Electronic Technical Co., Ltd: "Wire Cutting Stripping Machine CSC-508SD", Aug. 22, 2016, 5 pages [online], [retrieved on Feb. 6, 2017]. Retrieved from the Internet: <URL:http://www.wirecuttermachine.com/Cable-Wire-Cut-Strip/Wire-Cutting-Stripping-Machine-CSC508SD.html>.

Ingrid West Machinery Ltd, "Compact 300MM Wide Foil Winding Machine Series for LV Transformers", Oct. 23, 2016, 3 pages [online], [retrieved on Feb. 6, 2017]. Retrieved from the Internet: <URL:http://www.coilwindingmachines.eu/heavy_duty_winding_machines/compact_foil_winding_machine.html>.

Ingrid West Machinery Ltd, "Enamel Wire Strippers—Abrasive Wheel Version", Oct. 23, 2016, 2 pages [online], [retrieved on Feb. 6, 2017]. Retrieved from the Internet: <URL:http://www.coilwindingmachines.eu/production_aids/s02_stone_style_wire_stripper.html>.

Ingrid West Machinery Ltd, "Expandable Winding Mandrels", Oct. 23, 2016, 5 pages [online], [retrieved on Feb. 6, 2016]. Retrieved from the Internet: <URL:http://www.coilwindingmachines.eu/heavy_duty_winding_machines/expanding_mandrel_to_hold_coil_during_winding.html>.

* cited by examiner

AUTOMATED WIRE PROCESSING SYSTEM AND METHODS

TECHNICAL FIELD

The disclosure relates generally to wire processing and more specifically, for example, to wire processing for wire harnesses used in aircraft.

BACKGROUND

High reliability is often needed for wiring harnesses such as those used in aircraft subsystems. The production process used to fabricate such harnesses are required to be of high standards, including using high quality wires, connections, and connectors and assembling them in a repeatable manner that minimizes failure. Such high standards have traditionally rendered automated wire assembly systems impractical for fabricating aircraft wiring harnesses.

SUMMARY

Systems and methods are disclosed herein for wire processing. In certain examples, an electrical component delivery device is disclosed. The electrical component delivery device may include a body, a wire channel disposed within the body, including a wire channel entry and a wire channel exit, and configured to receive a wire, and one or more fluid guides disposed within the body, fluidically connected to the wire channel. The fluid guide may include a guide entry, a guide fluid channel, and a guide exit. The guide entry may be configured to receive a fluid from an fluid source. The guide exit may be configured to flow the fluid into the wire channel to move a component coupled to the wire. The guide fluid channel may fluidically connect the guide entry to the guide exit.

The scope of the invention is defined by the claims, which are incorporated into this section by reference. A more complete understanding of the disclosure will be afforded to those skilled in the art, as well as a realization of additional advantages thereof, by a consideration of the following detailed description of one or more implementations. Reference will be made to the appended sheets of drawings that will first be described briefly.

BRIEF DESCRIPTION OF THE DRAWINGS

Examples of the disclosure and their advantages are best understood by referring to the detailed description that follows. It should be appreciated that like reference numerals are used to identify like elements illustrated in one or more of the figures.

DETAILED DESCRIPTION

Figure 1:
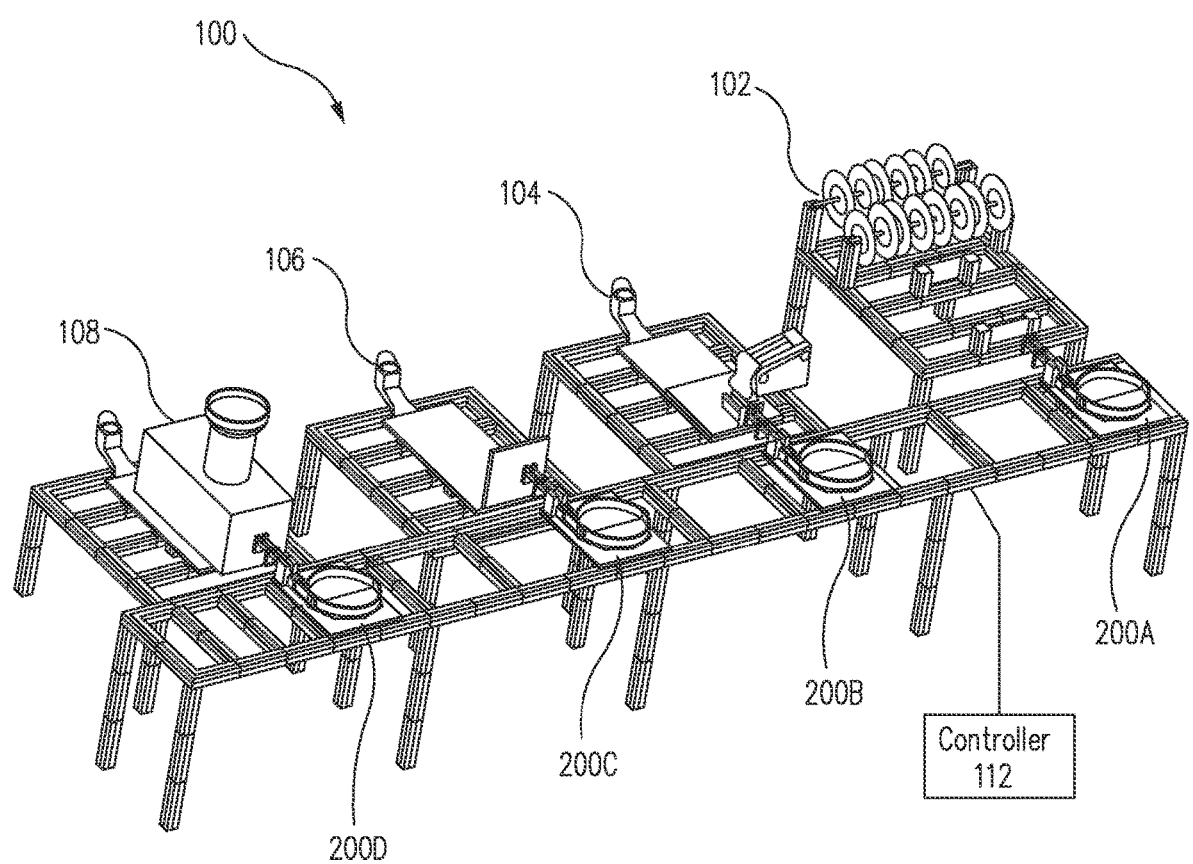
FIG. 1 illustrates a view of a wire processing system in accordance with an example of the disclosure.

Systems and techniques for wire processing are described in the disclosure herein in accordance with one or more examples. The wire processing system may include a plurality of processing stations. The plurality of processing stations may include one or more of a wire transport, an electrical component delivery device, and/or a solder sleeve positioning station.

The systems and techniques described herein allow for improved wire processing in the manufacture of wire harnesses for aircraft applications. The systems and techniques described herein include a plurality of stations that may manufacture such wire harnesses by performing one or more discreet steps in the manufacturing of such harnesses. Examples of such steps include receiving a coil of wire, stripping the wire at a predetermined area, positioning an electrical component over the stripped area, and soldering the electrical component over the stripped area. Certain other examples may include additional steps in the manufacturing of such wire harnesses such as inserting the wire into a receptacle of a connector, soldering the wire to the connector, bundling together a plurality of wires, and attaching insulation to one or more wires.

Various such stations are described herein. While certain stations described herein may perform one step in the manufacture of such harnesses (e.g., stripping the wire at a predetermined area or positioning an electrical component over the stripped area), other stations may perform a plurality of discreet steps (e.g., positioning the electrical component over the stripped area and soldering the electrical component to the wire).

The stations described may also be modular stations. That is, the stations may be arranged as needed due to the requirements of the wire harness manufacturing steps. Accordingly, if two electrical components need to be soldered to the wire, then two such stations or sets of stations performing steps involved in soldering the electrical components to the wire may be used in the system.

As an illustrative example, such a wire processing system includes, at least, a wire transport that receives wire and transports the wire between various stations for processing. The system further includes a station that provides wire to the wire transport, a station that provides an electrical component to the wire and/or moves the electrical component on the wire, a station that strips a portion of the wire, a station that positions the electrical component over the stripped portion of the wire, and a station that solders the electrical component to the wire. In certain such examples, the station that provides the electrical component to the wire and/or moves the electrical component on the wire includes an electrical component delivery device and the station that positions the electrical component over the stripped portion of the wire is a solder sleeve positioning station. Other examples may include other or additional stations and may arrange the stations in any number of ways.

The wire transport includes a wire retaining tray and one or more wire retainers. Thus, wire can pass through the one or more wire retainers to the wire retaining tray. The wire retainers may be coupled to one or more springs that may exert a force on the one or more wire retainers to position the wire retainers relative to the wire retaining tray. The one or more wire retainers may also include one or more wire holding mechanisms configured to hold at least a portion of the wire in a substantially straight orientation within the one or more retainers.

The electrical component delivery device is a part of a processing station that moves or threads an electrical component onto the wire. In operation, the electrical component delivery device receives compressed air or another fluid and flows the compressed air through internal channels so that the flow of the compressed air moves the electrical component down the wire. The electrical component delivery device may include a wire channel configured to receive a wire and disposed within a body of the electrical component delivery device. The body may additionally include one or more fluid guides disposed within the body. The one or more fluid guides may be fluidically connected to the wire channel and may include a guide entry, a guide fluid channel, and a guide exit.

The solder sleeve positioning station positions the electrical component over a stripped portion of the wire. In operation, the solder sleeve positioning station grasps a wire, repositions the wire, and grasps a new portion of the wire until the solder sleeve positioning station detects that an electrical component is being grasped. The electrical component is then moved to the stripped portion of the wire. As such, the solder sleeve positioning station may include a wire guide configured to receive and position the wire and a solder sleeve pincher. The solder sleeve pincher may include a pinching portion configured to hold the wire and/or the electrical component and move the wire and/or the electrical component. Additionally, the solder sleeve positioning station may include a pincher sensor configured to output sensor data associated with a position of the solder sleeve pincher.

As an illustrative example, a wire processing system is illustrated in FIG. 1. FIG. 1 illustrates a perspective view of a wire processing system 100 in accordance with an example of the disclosure. Wire processing system 100 includes a first station 102, a second station 104, a third station 106, a fourth station 108, and a plurality of wire transports 200A-D.

Stations 102-108 include one or more different types of wire processing stations. For example, such stations may provide wire to one or more rotational wire transports, cut wires, strip wires, slice wires, solder wires, attach one or more components (e.g., solder sleeves, connectors, Printed Circuit Boards (PCBs), and/or other such components) to the wires, and/or perform other wire processing and/or manufacturing steps. In certain such examples, the wire transports 200A-D are configured to receive wire at one station and move the wire to another station for further processing.

In an illustrative example, station 102 is a station that provides a wire to the wire transports. In the illustrated example, station 102 is providing wire to wire transport 200A. The wire provided may be coiled around and/or within the wire transport 200A. In certain examples, at least a portion of the wire provided is held within a wire retaining tray of the wire transport 200A.

In the illustrated example, the wire transport 200A then moves to a subsequent station, such as for example, station 104, for further processing. It should be realized that in the illustrated embodiment, the processing system 100 is configured as an assembly line, such that after wire transport 200A receives the wire from station 102, wire transport 200A moves from station 102 to station 104 as described below. Additionally, and substantially concurrently, wire transport 200B moves to station 106, wire transport 200C moves to station 108, etc. In such an example, station 104 receives the wire transport 200A and positions the wire of the wire transport 200A in an orientation to move an electrical component threaded onto the wire 906. This configuration enables the solder sleeve to be installed on the wire prior to the wire end being stripped as described below. Once the wire end is stripped, the solder sleeve is then repositioned such that it can be permanently coupled to the end of the wire. The solder sleeve is installed on the wire such that the solder sleeve is movable along a length of the wire. The solder sleeve may be installed at station 104, using for example the electrical component delivery device 902 described in FIGS. 9-15. Optionally, the electrical component delivery device 902 may form part of station 102. In further embodiments, the electrical component may be preinstalled on the wire, installed by hand, or installed using another technique.

In certain examples, the electrical component may be moved by, for example, a mechanism that moves the electrical component on the wire via compressed air, such as the electrical component delivery device 902 referred to above and described in more detail below. The electrical component delivery device 902 may receive the wire with the electrical component positioned on the wire within a wire channel 1008, receive compressed air through at one or more guide fluid channels such that the compressed air discharged from the guide fluid channels contacts the electrical component and thus forces the electrical component positioned within wire channel 1008 to move along the wire. The wire transport 200A, or any of the wire transports described herein, may also include features (such as bottoming features) that may stop the electrical component at a certain position on the wire so that the electrical component is consistently within a fixed area along the length of the wire.

The wire transport 200A then moves to another station, such as for example, station 106. The wire transport 200A may, in a certain example, move between stations via one or more rails. As such, the wire transport 200A may be coupled to the one or more rails and the one or more rails may guide movement of the wire transport. The one or more rails may include mechanisms that move the wire transports and/or the wire transports themselves may include such mechanisms to move the wire transports between stations.

In the example shown in FIG. 1, station 106 is configured to receive the wire and cut the wire and/or strip a portion of the wire (e.g., a portion of the insulation and/or shielding). Station 106, in certain examples, includes mechanisms that may bottom against (e.g., physically contact) one or more bottoming features of the wire transport 200A (e.g., the wire retainer 206A shown in FIGS. 3-7) and, from such bottoming features, then determines the area of the wire to be stripped. As such, in certain such examples, a portion of the station 106 is configured to bottom against the feature, position itself against the bottoming feature to determine the portion of the wire to be cut, cut the wire, and strip the wire according to the position of the wire relative to the bottoming feature.

The wire transport 200A then moves to station 108. Station 108 is configured to position the electrical component on the wire or, in the case of a solder sleeve, reposition the solder sleeve on the wire. In certain examples, station 108, for example, adjusts the position of the electrical component so that at least a portion of the electrical component is positioned over a portion of the stripped portion of the wire. In certain other examples, station 108 further processes the electrical component positioned on the wire (e.g., solders the electrical component onto the wire).

In certain other examples, other stations may, alternatively or additionally, perform other actions (e.g., couple one or more connectors to the wire, couple the wire to one or more other wires to form a harness, solder the wire to another wire or other electrical component, affix one or more identifying components such as stickers, print installation or other identifying information on the wire, and/or perform other such actions). Also, other examples may position one or more stations 102-108 in orders different from that described herein. Certain such examples may include fewer and/or additional stations.

In certain examples, one or more controllers (e.g., a controller 112) are configured to control the operation of the wire processing system 100 and/or one or more systems and/or subsystems thereof. The controller 112 may include, for example, a single-core or multi-core processor or microprocessor, a microcontroller, a logic device, a signal processing device, memory for storing executable instructions (e.g., software, firmware, or other instructions), and/or any elements to perform any of the various operations described herein. In various examples, the controller 112 and/or its associated operations may be implemented as a single device or multiple devices (e.g., communicatively linked through analog, wired, or wireless connections such as through one or more communication channels) to collectively constitute the controller 112.

The controller 112 may include one or more memory components or devices to store data and information. The memory may include volatile and non-volatile memory. Examples of such memories include RAM (Random Access Memory), ROM (Read-Only Memory), EEPROM (Electri-cally-Erasable Read-Only Memory), flash memory, or other types of memory. In certain examples, the controller 112 may be adapted to execute instructions stored within the memory to perform various methods and processes described herein, including implementation and execution of control algorithms responsive to sensor and/or operator (e.g., flight crew) inputs.

Figure 2:
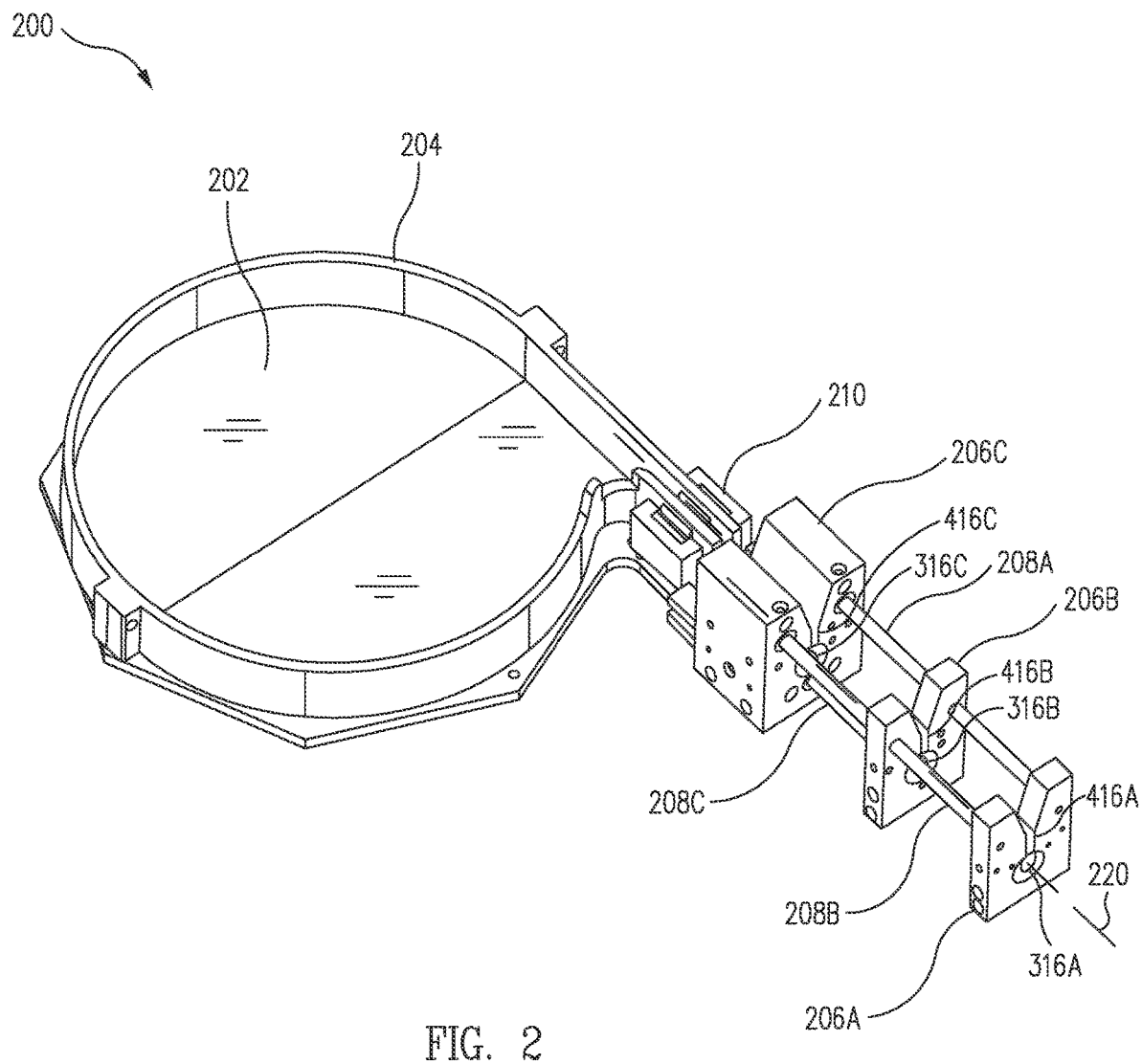
FIG. 2 illustrates a view of a wire transport in accordance with an example of the disclosure.

FIG. 2 illustrates a view of a wire transport 200 in accordance with an example of the disclosure. As shown in FIG. 2 the wire transport 200 includes a wire retaining tray 202 with a wall 204, wire retainers 206A-C coupled by retainer guides 208A-C, and a guide 210.

Wall 204 defines, at least in part, a perimeter of wire retaining tray 202. Wire retaining tray 202 is configured to carry and/or store wire. In certain examples, wall 204 coils and/or aids in coiling the wire provided to wire transport 200. In certain such examples, when wire is being provided by station 102, for example, the wire contacts the wall 204 and is wound to substantially conform to a portion of wall 204 such as an interior surface of the wall 204. Wire retaining tray 202, in certain examples, winds such wire through multiple rotations and thus coils the wire.

In certain examples, wire is provided to wire retaining tray 202 through wire retainers 206A-C. In operation, the wire retainers 206A-C hold the wire in a straight orientation and are configured to be compressible to allow various wire processing stations to interface with the wire transport 200 during wire processing. Accordingly, during operation, wire transport 200 arrives at a processing station and features of the processing station contacts the wire transport 200. Contacting the wire retainers 206A-C may aid the processing station in locating the wire carried by wire transport 200. Additionally, compressing wire retainers 206A-C can aid in locating specific portions of the wire such as a stripped portion of the wire by, for example, compressing wire retainers 206A-C until the wire retainers 206A-C can no longer compress and then determining where the location of the stripped portion is relative to where the wire retainers 206A, 206B, and/or 206B are in the fully compressed state. In certain such examples, the one or more wire retainers 206A-C include one or more wire holding mechanisms 314A-D (not shown, but shown and described in more detail below in FIGS. 3-5).

In certain other examples, wire retainers 206A-C are coupled together. For example, wire retainers 206A-C may be coupled through sliders, sliding rods, springs, hinges, and/or other such mechanisms that may allow wire retainers 206A-C to move relative to each other and/or wire retaining tray 202. For example, such features may control the distance, orientation, and/or other geometric relationship of wire retainers 206A-C to each other, to wire retaining tray 202, and/or to other features of wire transport 200.

In certain such examples, at least one of the mechanisms is, for example, spring loaded such that wire retainers 206A-C may be configured to return to a set or baseline position if no outside force is applied to the wire retainers 206A-C. For example, such mechanisms may be configured so that wire retainers 206A-C may be configured to move between at least an extended configuration (shown in FIGS. 3-5) and a retracted configuration (shown in FIG. 7). In certain examples, the extended configuration is a configuration where wire retainers 206A-C are farther apart from each other and/or wire retaining tray 202 then in the retracted configuration. In certain such examples, wire retainers 206A-C are farther apart from each other and/or wire retaining tray 202 when in the extended position and wire retainers 206A-C are closer to each other and/or wire retaining tray 202 when in the retracted position. As such, for example, wire retainers 206A and wire retainers 206C are separated by a first distance in the extended position and are separated by a second distance in the retracted position. In the example illustrated, the mechanisms are configured to return wire retainers 206A-C to the extended position if no outside force is applied, i.e., the set or baseline position of the wire retainers 206A-C is in the extended position.

Guide 210 includes, in certain examples, one or more additional components that hold and/or aid in holding wire in a substantially straight or linear orientation such as, for example, walls 222 that are configured to guide the wire. In certain examples, guide 210 is configured to hold wire in an orientation parallel or collinear with axis 220 so that the portion of the wire passing through guide 210 and wire retainers 206A-C is in a substantially straight orientation and/or in a substantially similar orientation when passing through guide 210 and/or wire retainers 206A-C. Additionally, guide 210 may, additionally or alternatively, include certain features that may allow and/or prevent wires from being inserted into guide 210, such as features similar to those described herein for wire retainers 206A-C. Guide 210 may also include features that couple to wire retaining tray 202 and/or wire retainers 206A-C (e.g., mounting points for the one or more sliders, sliding rods, springs, hinges, and/or other such mechanisms that may allow wire retainers 206A-C to move relative to each other and/or wire retaining tray 202). In certain examples, wire retaining tray 202 is coupled to guide 210 on one end of guide 210 and wire retainers 206A-C are coupled to guide 210 on a second end of guide 210. Wire held by the wire retaining tray 202 may pass within guide 210 and through outlet 224 into wire retainers 206A-C.

Retainer guides 208A-C, in certain examples, guide a movement of wire retainers 206A-C. For example, retainer guides 208A-C control movement of wire retainers 206A-C relative to other wire retainers and/or to other features of wire transport 200. As such, in certain examples, retainer guides 208A-C control and/or aid in controlling translation of wire retainers 206A-C.

Figure 5:
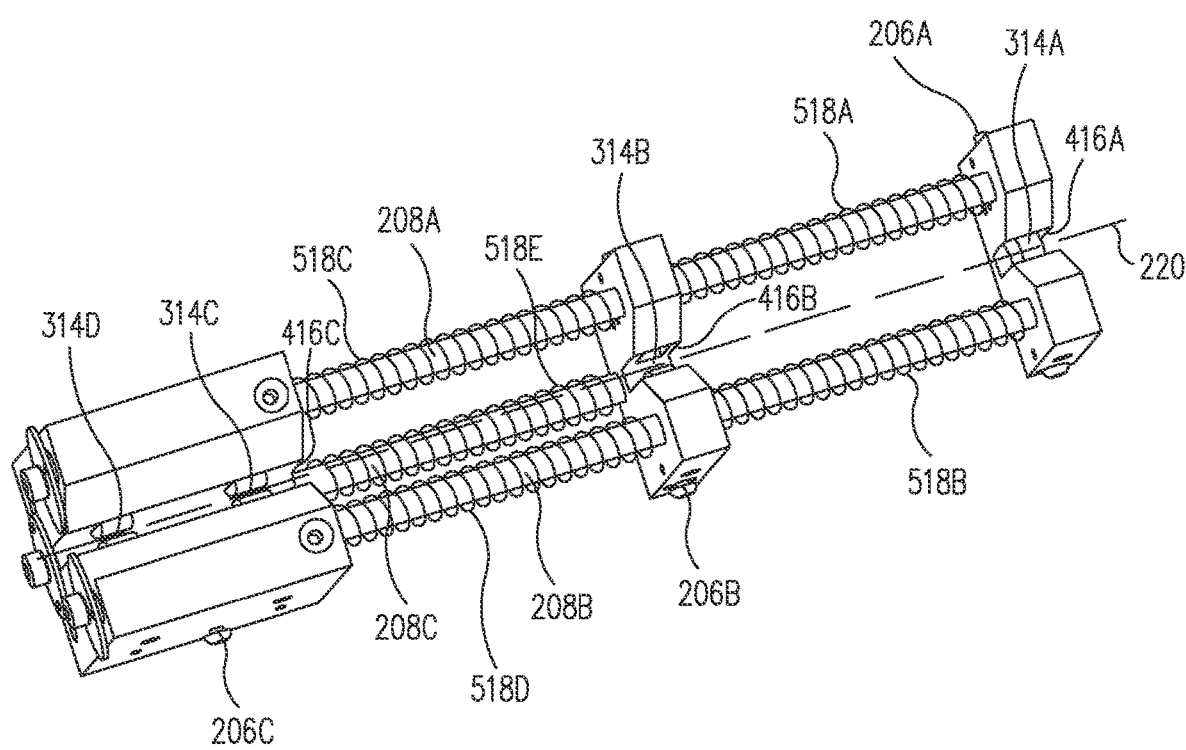
FIG. 5 illustrates a view of wire retainers in an extended configuration in accordance with an example of the disclosure.

In certain examples, springs, such as springs 518A-D shown in FIG. 5, are coupled to wire retainers 206A-C and/or wire guides 208A-C. Such springs may be configured to exert a force on one or more wire guides 208A-C so that, absent an outside force, the one or more wire guides 208A-C may be configured to move to a default position. Such a default position may be, for example, the extended position, the retracted position, and/or an intermediate position (e.g., a position between the extended position and the retracted position). Exemplary springs 518A-D are described below in FIG. 5.

Figure 3:
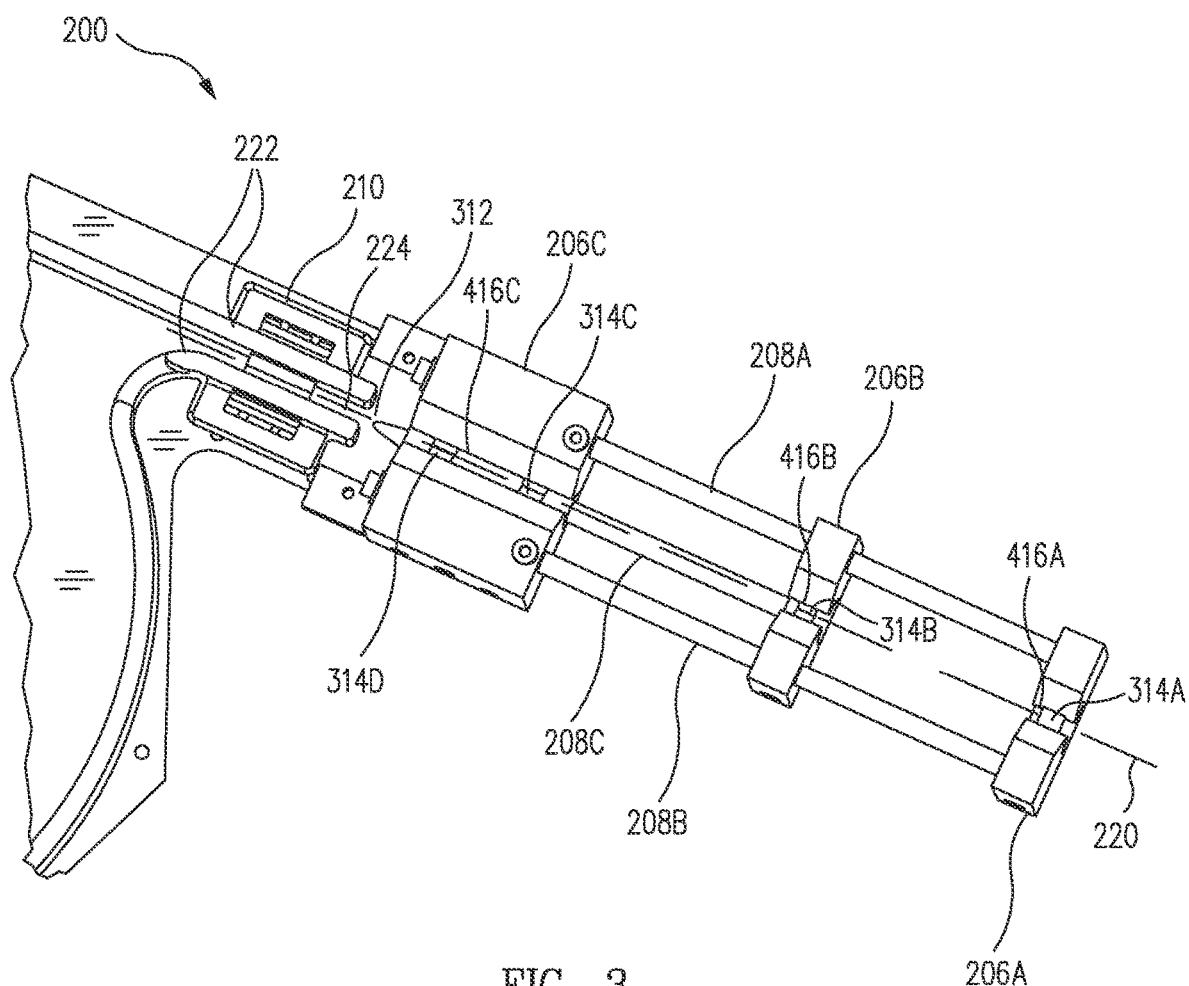
FIG. 3 illustrates a view of wire retainers of a wire transport in accordance with an example of the disclosure.

FIG. 3 illustrates another view of the wire retainers 206A-C and the wire guide 210 shown in FIG. 2.

Each wire retainer 206A-C illustrated in FIG. 3 includes a respective wire holding mechanism 314A-D. In operation, the wire holding mechanisms 314A-D are configured to move between at least an open position and a closed position. The open position allows wire of a first gauge or narrower (e.g., a wire with a diameter equal to or less than the diameter of the gauge) to pass through vertical openings 416A-C into an opening or cavity of the respective wire retainers 206A-C (e.g., into horizontal openings 316A-C shown in FIG. 4). The closed position prevents the wire from passing through the vertical openings 416A-C and/or prevents a wire of a second gauge (that is the same or different from the first gauge) from passing through the vertical openings 416A-C. Thus, the closed position allows the wire holding mechanisms 314A-D to hold a wire within, at least, the horizontal openings 416A-D.

In certain such examples, wire holding mechanisms 314A-D are configured to default to the closed position and/or return to the closed position. Moreover, the wire holding mechanisms 314A-D are further configured to move to the open position when a force greater than a threshold force is applied to one or more wire holding mechanisms 314A-D (e.g., from a wire being inserted into one or more wire retainers 206A-C). In certain examples, each of the wire retainers 206A-C moves between the closed and open positions independently.

In some examples, after the wire has been inserted, wire holding mechanisms 314A-D are configured to move to the closed position to hold the wire in a static position within the wire holding mechanisms 314A-D. In certain such examples, the wire holding mechanisms 314A-D are positioned to apply a retaining force to hold the wire within, for example, horizontal openings 316A-C. In certain examples, wire holding mechanisms 314A-D may be configured so that, in the closed position, the wire holding mechanisms 314A-D prevents the wire from passing through the vertical openings 416A-C, but allows enough space within horizontal openings 316A-C so that an electrical component threaded onto the wire may move along the wire and, thus, pass through at least some of the horizontal openings 316A-C.

In certain additional examples, one or more wire holding mechanisms 314A-D are configured to hold the wire unless a force is exerted to move the one or more wire holding mechanisms 314A-D from the closed position to an open position and, thus, move the wire through the one or more wire holding mechanisms 314A-D. In certain examples, the wire holding mechanisms 314A-D are configured to hold at least a portion of the wire in a substantially straight or linear orientation. Retainer guides 208A-C, in certain examples, guide the movement of one or more wire retainers 206A-C as described herein. For example, as shown in FIG. 3, retainer guides 208A-C are configured to guide wire retainers 206A-C to translate along axis 220. Axis 220 may, for example, be an axis that is substantially parallel or collinear to an orientation of the wire and/or a direction of travel of the electrical component. In certain such examples, axis 220 is parallel with at least a portion of wall 204 (e.g., the portion of wall 204 closest to wire retainers 206A-C as shown in FIG. 2). In certain examples, one or more springs are coupled to wire retainers 206A-C and/or wire guides 208A-C. Such springs may be configured to exert a force on one or more wire guides 208A-C so that, absent an outside force, the one or more wire guides 208A-C may be configured to move to a default position. Such springs are described in further detail herein in FIG. 5.

In certain examples, wire guide 210 and/or one or more of the wire retainers 206A-C includes a stop 312. Stop 312 is configured to stop and/or slow an electrical component (e.g., a solder sleeve) that may be coupled to the wire. Stop 312 may be a hard stop (e.g., a wall), a formed feature (e.g., formed through machining, casting, and/or another production process such as a tapering channel) on one or more of wire guide 210 and/or one or more wire retainers 206A-C, a spring and/or other feature that may exert a deceleration force on the electrical component, and/or another such feature that may stop and/or slow the electrical component. In certain such examples, wire holding mechanisms 314A-D are configured to allow the electrical component to move on the wire when the wire is inserted into the wire holding mechanisms 314A-D.

Figure 4:
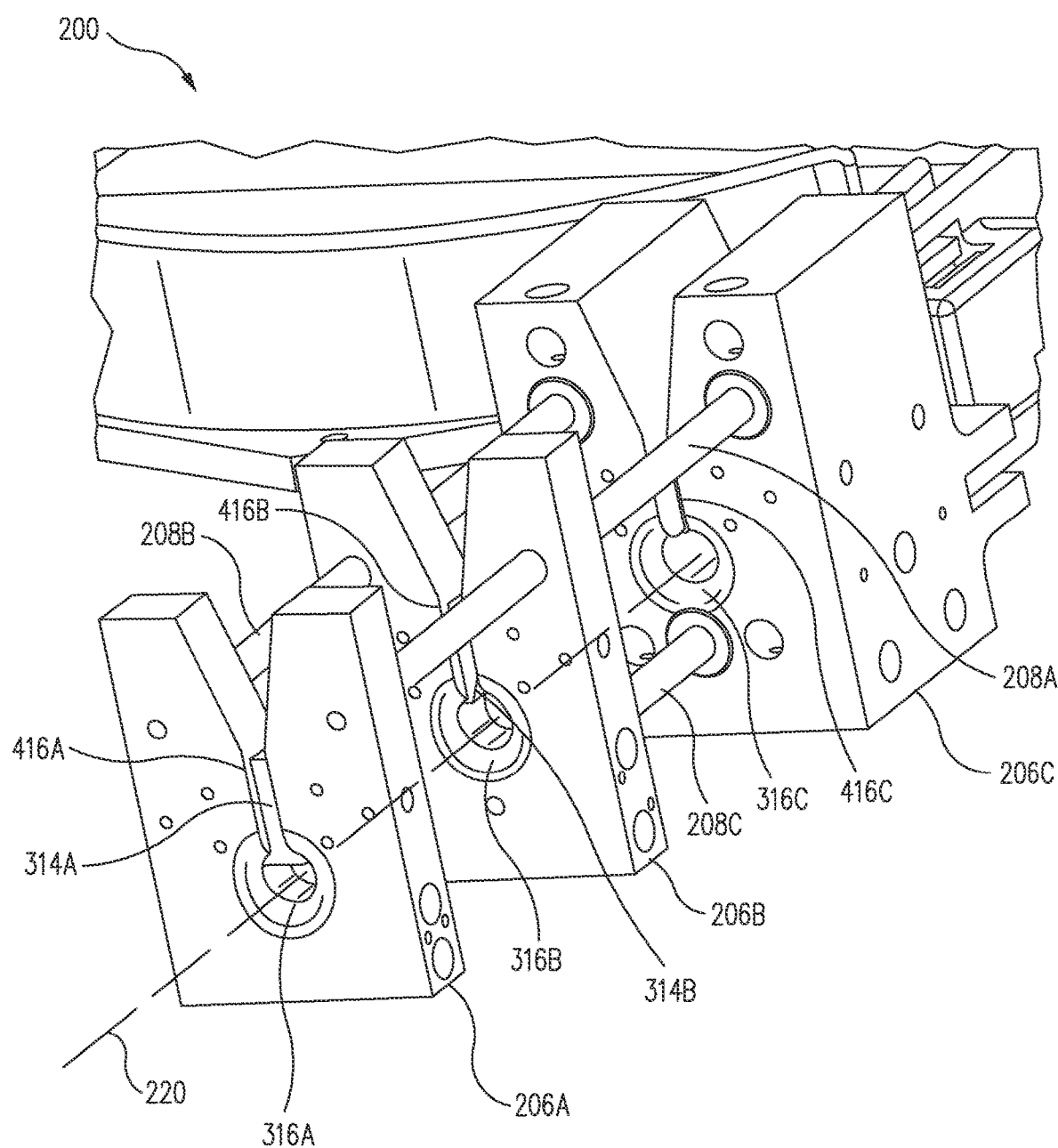
FIG. 4 illustrates another view of wire retainers of the wire transport in accordance with an example of the disclosure.

FIG. 4 illustrates another view of the wire retainers 206A-C shown in FIGS. 2 and 3. In FIG. 4, the wire retainers 206A-C include wire holding mechanisms 314A-D (wire holding mechanisms 314C and 314D are not shown in FIG. 4, but shown in FIG. 3), vertical openings 416A-C, horizontal openings 316A-C, and guides 208A-C.

Vertical openings 416A-C may be openings on a top portion of wire retainers 206A-C. In certain examples, vertical openings 416A-C may be sized so that only wire of a certain thickness/gauge or smaller can pass through vertical openings 416A-C.

Wire holding mechanisms 314A-D control whether the wire is allowed to pass through the vertical openings 416A-C. In the example shown in FIG. 4, wire holding mechanisms 314A-D are disposed within vertical openings 416A-C. When a force greater than a threshold force is applied to a wire holding mechanism 314A-D (e.g, by pushing on a wire disposed on one of the wire holding mechanisms 314A-D), the respective wire holding mechanism 314A-D moves from a closed position to an open position and allows the wire to pass through the respective vertical opening 416A-C into horizontal openings 316A-C. After the wire has passed through, the wire is then disposed in one or more horizontal openings 316A-C and the respective wire holding mechanism 314A-D then returns to the closed position. The wire holding mechanisms 314A-D may, for example, be spring loaded so that wire holding mechanisms 314A-D default or return to the closed position.

Horizontal openings 316A-C are configured to hold or maintain a wire in a substantially straight or linear orientation between, at least, wire retainers 206A-C. As such, in certain examples, horizontal openings 316A-C are positioned so that the openings are oriented in a substantially linear orientation. In the example shown in FIG. 4, horizontal openings 316A-C also include features such as curved and/or chamfered lead-ins on at least a portion of horizontal openings 316A-C to aid in guiding the wire through horizontal openings 316A-C and prevent and/or minimize wear on the wires resulting from movement of the wire within horizontal openings 316A-C.

In certain additional examples, after the wire has passed through the vertical openings 416A-C, the wire holding mechanisms 314A-D return to the closed position to hold the wire within horizontal openings 316A-D. In such examples, the wire holding mechanisms 314A-D are configured to prevent the wire from passing back through vertical openings 416A-C unless a force is exerted to move the wire holding mechanisms 314A-D from the closed position to the open position.

In certain examples, wire holding mechanism 314A is a one piece wire holding mechanism. Thus, wire holding mechanism 314A retracts (e.g., retracts when in the open position) into one side of the vertical opening 416A.

Wire holding mechanisms 314A is configured to exert a force on a wire disposed within horizontal opening 316A. As such, in at least the closed position, a portion of wire holding mechanism 314A is disposed within horizontal opening 316A. Thus, the size of the horizontal opening 316A is shrunk by the wire holding mechanism 314A and, in certain such examples, the size may be that of the thickness of the wire or slightly smaller to hold wire. Such an example may be useful for preventing the wire from being moved and, additionally, wire holding mechanism 314A may be configured to be a stop for any electrical component moving on the wire. A processing station can then be programmed to pick up the electrical component from where the electrical component is bottomed against the wire holding mechanism 314A for further processing.

In another example, wire holding mechanisms 314B-D. Thus, wire holding mechanisms 314B-D are connected to both sides of wire retainers 206B-C that form the vertical openings 416A-C and are configured so that one portion of the wire holding mechanism is configured to retract into one side of the vertical openings while the other portion of the wire holding mechanism is configured to retract into another side of the vertical openings. Other examples of wire holding mechanisms may be multi-piece (e.g., three of more piece) wire holding mechanisms.

Wire holding mechanisms 314B-D are two piece wire holding mechanisms and are not configured to exert a force on a wire disposed within horizontal opening 316B-C. As such, in at least the closed position, wire holding mechanisms 314B-D are not disposed within horizontal openings 316B-C. Such a configuration, when horizontal openings 316B-C are sized to be larger than the wire it is configured to hold, may allow an electrical component disposed on the wire to pass through horizontal openings 316B-C while the wire holding mechanisms 314B-D are in the closed position.

Figure 6:
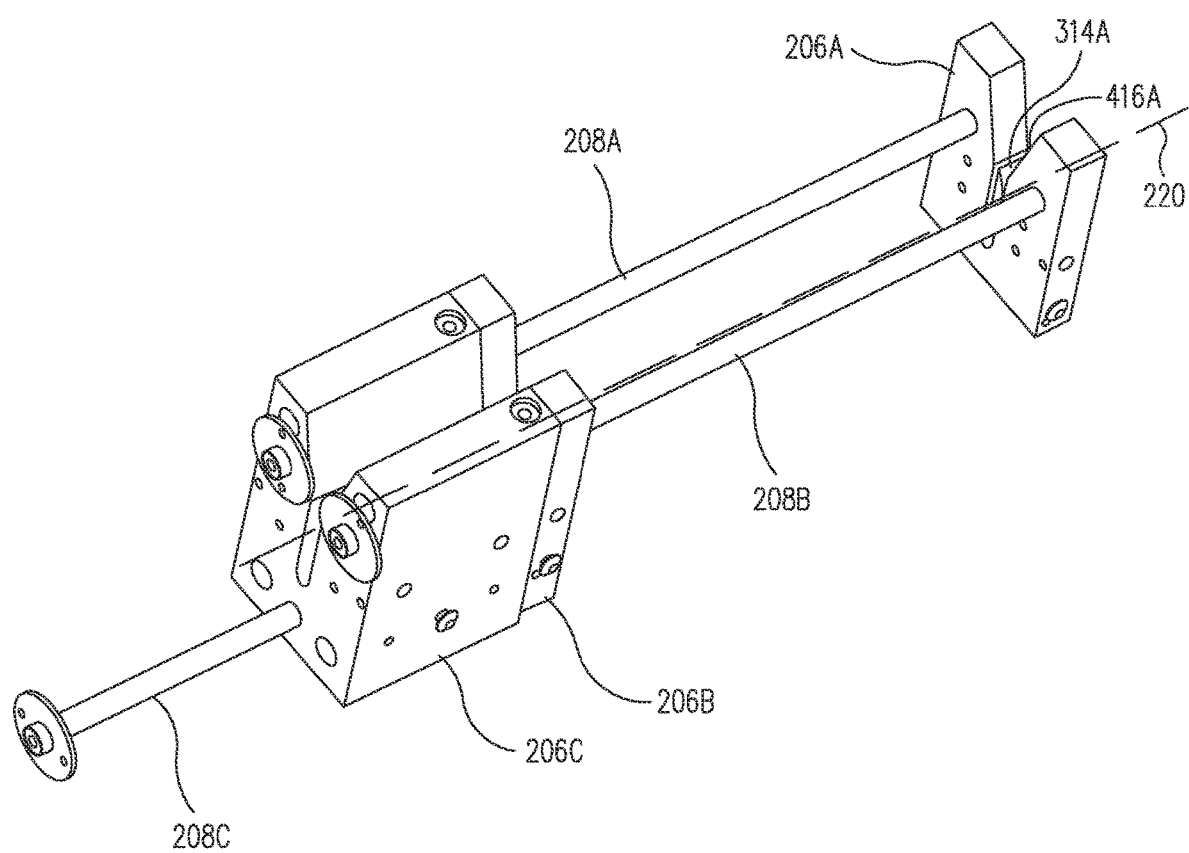
FIG. 6 illustrates a view of wire retainers in an intermediate configuration in accordance with an example of the disclosure.
Figure 7:
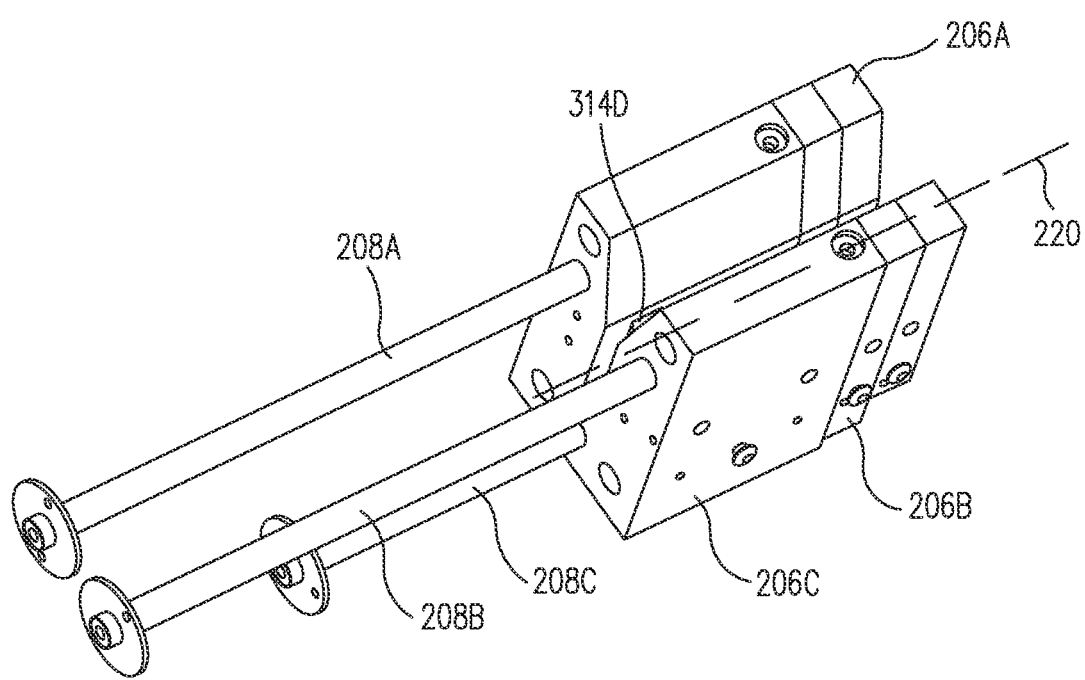
FIG. 7 illustrates a view of wire retainers in a retracted configuration in accordance with an example of the disclosure.

FIG. 5 illustrates a view of the wire retainers 206A-C in an extended configuration in accordance with an example of the disclosure. FIG. 6 illustrates a view of the wire retainers 206A-C in an intermediate configuration in accordance with an example of the disclosure. FIG. 7 illustrates a view of the wire retainers 206A-C in a retracted configuration in accordance with an example of the disclosure.

As illustrated in FIGS. 5-7, guides 208A-C are spring loaded (e.g., springs are coupled to the guides 208A-C and configured to impart a force to the guides 208A-C and/or wire retainers 206A-C to move the guides 208A-C and/or wire retainers 206A-C to a default position when no external force is exerted on the one or more guides 208A-C and/or wire retainers 206A-C). Such springs may be, for example, coil springs, torsion springs, leaf springs, bump rubbers (e.g., deformable materials), flat springs, tension springs, and/or other such mechanisms that may exert such force.

FIG. 5 shows springs 518A-E coupled to guides 208A-C. In the example shown, springs 518A-E are coil springs configured to exert force on one or more of guides 208A-C and/or wire retainers 206A-C. Spring 518A is coupled to guide 208A between wire retainers 206A and 206B. Spring 518B is coupled to guide 208B between wire retainers 206A and 206B. Spring 518C is coupled to guide 208A between wire retainers 206B and 206C. Spring 518D is coupled to guide 208B between wire retainers 206B and 206C. Spring 518E is coupled to guide 208C between wire retainers 206B and 206C. Each of the respective springs 518A-E is configured to move the guides 208A-C and/or wire retainers 206A-C to a default position when no external force is exerted on the guides 208A-C and/or wire retainers 206A-C.

Other configurations include configurations of the springs different from the configuration shown in FIG. 5. For example, one such configuration may be springs that are internal to the one or more of wire retainers 206A-C and/or guides 208A-C. Thus, in such an example, the springs may be housed within wire retainer 206C and may be compressed when wire retainers 206A and/or 206B move from the extended position to the retracted position. In certain additional examples, guides 208A-C may be, for example, telescoping rods that may include springs disposed within the telescoping rods. FIGS. 6 and 7 show a configuration where the springs are internal to the wire retainers 206A-C.

In certain examples, certain guides are coupled to all wire retainers. For example, in FIGS. 5-7, while guides 208A and 208B are coupled to wire retainers 206A-C, guide 208C is only coupled to wire retainers 206B and 206C. As such, the amount of force exerted by the one or more springs on each of the wire retainers 206A-C may be adjusted accordingly by, for example, coupling a greater or lesser amount of springs to one or more wire retainers 206A-C or selecting springs having different spring constants. Additionally, various guides 208A-C may be used to control positions of various wire retainers 206A-C in, at least, the extended and/or retracted positions. For example, guide 208C (e.g., the length of guide 208C) is used to control the distance of the extended position of wire retainer 206B relative to wire retainer 206C, while guides 208A and 208B are used to control the distance of the extended position of wire retainer 206A relative to wire retainer 206C. In certain examples, the retracted positions is also be controlled by one or more features (e.g., stops, detents, and/or other such features) of guides 208A-C and/or another portion of wire transport 200. In the example shown in FIGS. 5-7, the retracted positions are at least partially controlled by one or more guides 208A-C contacting other guides 208A-C and/or compressing springs 208A-C to such an extent that the coils of springs 208A-C contact each other.

In FIG. 5, wire retainers 206A-C are shown in the extended positions. As such, wire retainer 206A and 206B are both in positions that are farthest from wire retainer 206C. In certain such examples, such as examples where guides 208A-C telescope, guides 208A and 208B are fully extended when wire retainer 206A is in the extended position and guide 208C are fully extended when wire retainer 206B is in the extended position. In certain other examples, such as examples with external springs such as the example shown in FIG. 5, wire retainers 206A and 206C may be located proximate to opposite sides of guides 208A and 208B and wire retainers 206B and 206C may be located proximate to opposite sides of guides 208C when in the extended positions.

FIG. 6 illustrates a situation where different wire retainers are moved to different positions (e.g., wire retainer 206A is in the extended position while wire retainer 206B is in the retracted position.) In FIG. 6, wire retainer 206B is shown in a retracted position while wire retainer 206A is shown in an extended position.

The wire retainers 206A-C of FIG. 6 are wire retainers where the springs are internal to wire retainer 206C. As such, wire retainer 206B is bottomed against wire retainer 206C (e.g., wire retainer 206B is moved to a closest possible position relative to wire retainer 206C when wire transport 200 is operating normally). Wire retainer 206A is in an extended position and thus, wire retainer 206A is moved to a farthest possible position relative to wire retainer 206C when wire transport 200 is operating normally. In certain such examples, one or more springs coupled to wire retainer 206B and/or guide 208C are compressed to enable the wire retainer 206B to move to the retracted position and one or more springs coupled to wire retainer 206A and/or guides 208A and/or 208B are fully extended (e.g., extended as much as possible when wire transport 200 is fully assembled) so that wire retainer 206A remains in the extended position.

In FIG. 7, wire retainers 206A and 206B are both shown in retracted positions. The wire retainers 206A-C of FIG. 7 are also wire retainers where the springs are internal to wire retainer 206C. As such, as shown in FIG. 7, wire retainer 206A contacts wire retainer 206B and wire retainer 206B contacts wire retainer 206C. In certain examples, such as examples where guides 208A-C may telescope, guides 208A-C may be in retracted positions. In certain additional examples, one or more springs coupled to guides 208A-C may exert force on wire retainers 206A and/or 206B to return wire retainers 206A and/or 206B to the extended position if no other force is exerted on wire transport 200.

Figure 8:
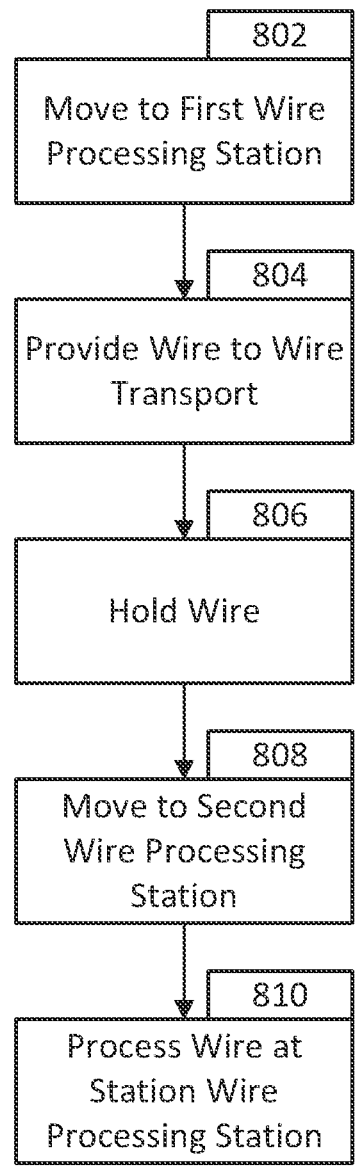
FIG. 8 is a flowchart detailing wire processing using the wire transport with the wire retainers in accordance with an example of the disclosure.

FIG. 8 is a flowchart detailing wire processing using the wire transport with the wire retainers in accordance with an example of the disclosure. In block 802, a wire transport is moved to a first wire processing station. In certain examples, moving the wire transport to the first wire processing station may include the wire transport contacting the first wire processing station in a manner that may move one or more wire retainers of the wire transport from an extended position to another position. For example, one or more wire retainers may be moved from the extended position to a retracted position and/or another position (e.g., an intermediate position between the extended position and the retracted position).

In block 804, after the wire transport has been moved to the first wire processing station, wire is provided to the wire transport (e.g., first station 102 of FIG. 1 may be such a first wire processing station and may provide wire to the wire transport). Wire may be threaded through one or more wire retainers and/or guides and may enter a wire retaining tray of the wire transport. The wire retaining tray may coil the wires into a roughly circular shape.

In block 806, wire provided to the wire transport is held by the wire transport. The wire may be held in a coil shape and/or other shape. In block 808, the wire transport, holding the wire, may be moved to a second wire processing station. The wire transport may be moved while one or more wire retainers are in the extended position. Moving the wire transport to the second wire processing station may include the wire transport contacting the second wire processing station in a manner that may move one or more wire retainers of the wire transport from an extended position to another position. In certain examples, the position that the one or more wire retainers are moved when contacting the second wire processing station may be the same and/or different from when the wire transport contacts the first wire processing station.

In block 808, the wire held by the wire transport is processed by the second wire processing station. As such, the second wire processing station may receive at least a portion of the wire held by the wire transport and, for example, cut the wire, strip the wire, splice the wire, provide an electrical component (e.g., solder sleeve, connector, and/or other such component) to the wire, solder a portion of the wire, couple multiple wires together, and/or perform other such wire processing actions.

Figure 9:
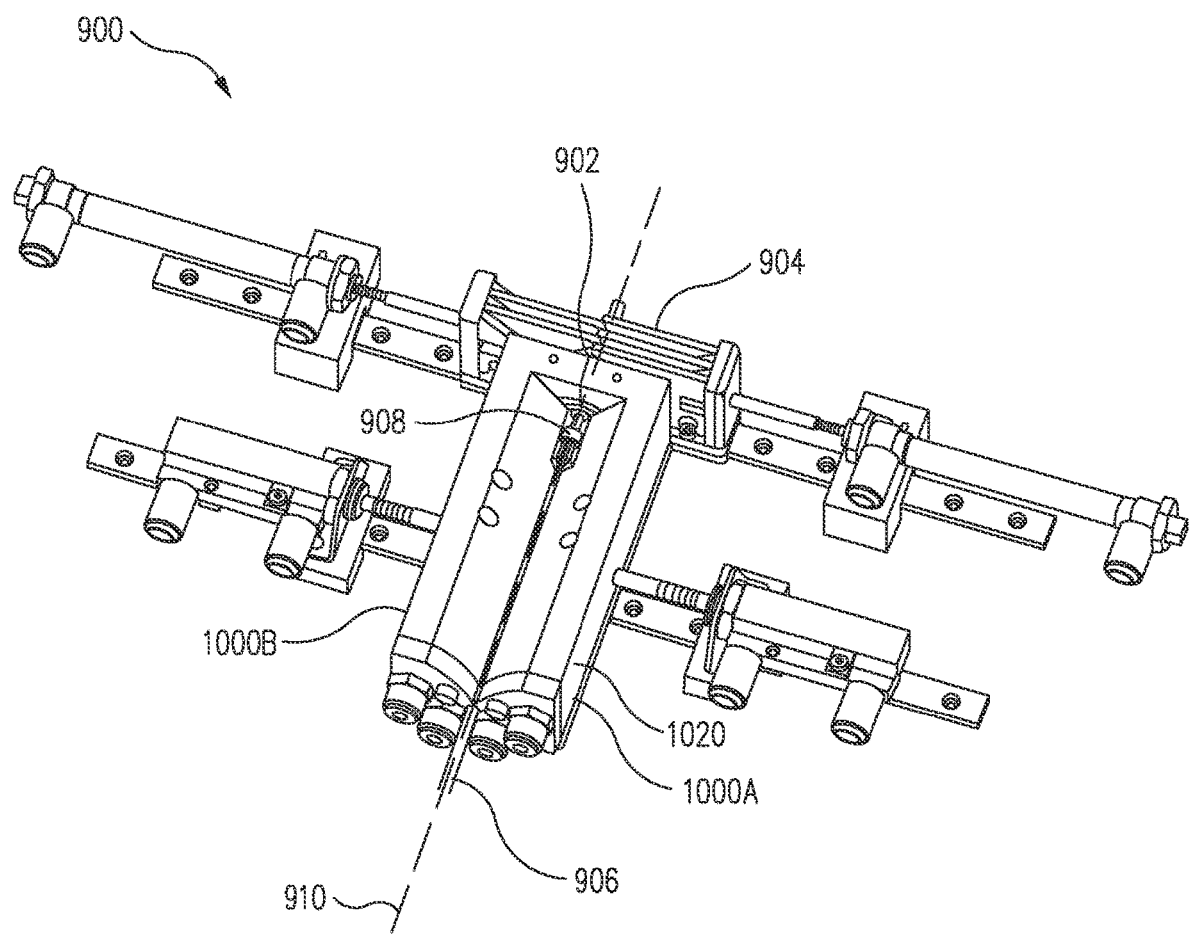
FIG. 9 illustrates a view of an electrical component delivery system in accordance with an example of the disclosure.

The wire transport may, for example, receive wire at station 102, move to station 104 to receive an electrical component with the wire, move to station 106 to strip a portion of the wire, and then move to station 108 to reposition the electrical component over the stripped portion. Station 104 may include an electrical component delivery system 900 to install the electrical component (e.g., solder sleeve 908) onto the wire (e.g., wire 906), as illustrated in FIG. 9.

The system 900 includes an electrical component delivery device 902, a wire positioner 904 configured to receive the wire 906 and the solder sleeve 908. Electrical component delivery device 902 is assembled from electrical component delivery device portions 1000A and 1000B.

The electrical component delivery system 900 is integrated into a processing station and moves an electrical component (e.g., solder sleeve 908) coupled to the wire 906, as described herein. In the illustrated embodiment, the system 900 forms part of the station 104 shown in FIG. 1. Broadly, electrical component delivery system 900 may operate within a system as described in the following paragraph.

The wire 906 is first held by wire transport 200. The wire transport 200 moves to station 104 and is positioned so that the wire 906 is substantially collinear with axis 910. The axis 910 is an axis of the wire channel 1008, shown in FIGS. 10-14. Once the wire 906 is substantially collinear with axis 910, wire retainers 206A-C of wire transport 200 are compressed by being pushed against wire positioner 904 (e.g., by moving wire transport 200 towards wire positioner 904 and/or by moving electrical component delivery system 900 towards wire transport 200). The wire 906 with solder sleeve 908 threaded onto the wire 906 is then inserted into the wire channel 1008 of the electrical component delivery device 902 and fluid (e.g., compressed air) is flowed through one or more fluid guides of electrical component delivery device portions 1000A and 1000B to "blow" the solder sleeve 908 and thus move it along the wire 906 to a desired position. Once the solder sleeve 908 has been blown to the desired position, wire transport 200 may pull away from station 104 and proceed to station 106 for further processing.

Figure 10:
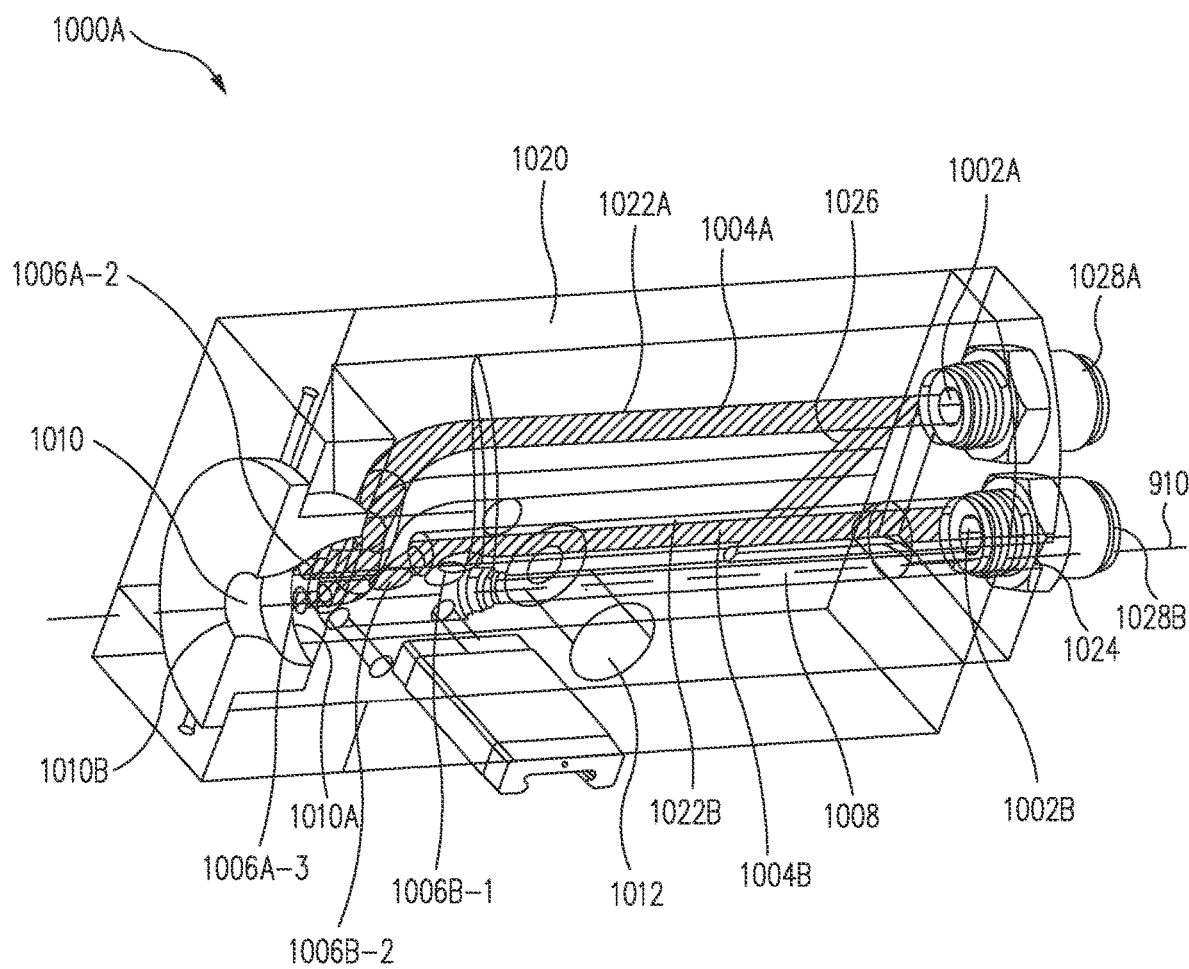
FIG. 10 illustrates a ghosted view of the electrical component delivery device in accordance with an example of the disclosure.
Figure 11:
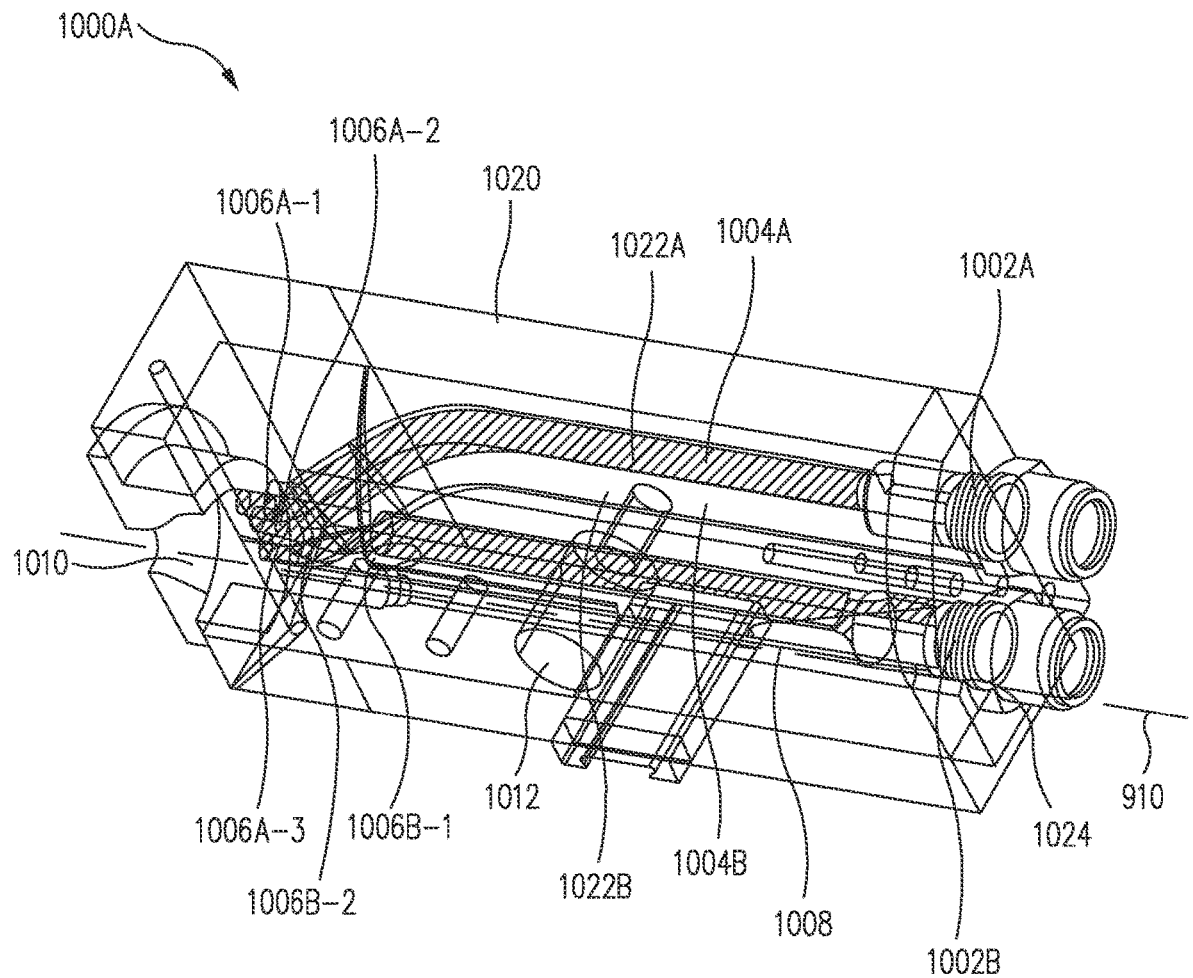
FIG. 11 illustrates another ghosted view of a portion of an electrical component delivery device in accordance with an example of the disclosure.

The electrical component delivery device portions 1000A and 1000B are mirrored or substantially mirrored components and each includes a device body 1020, a wire channel 1008 disposed within the body, and one or more fluid guides (e.g., fluid guides 1022A and 1022B) disposed within the body 1020. Wire channel 1008 and fluid guides 1022A and 1022B are shown in FIGS. 10 and 11. Each wire channel 1008 includes a wire channel entry 1024 and a wire channel exit 1010. The wire channel 1008 is configured to receive a wire. Each of the electrical component delivery devices 1000A and/or 1000B also includes one or more fluid guides 1022A and 1022B disposed within the body 1020. The one or more fluid guides 1022A and 1022B are fluidically connected to the wire channel 1008 and include, at least, a guide entry, a guide fluid channel, and a guide exit as described in further detail in FIGS. 10 and 11.

In certain examples, electrical component delivery devices 1000A and 1000B are assembled together to form the electrical component delivery device 902 shown in FIG. 9. As such, the body of each of the electrical component delivery devices 1000A and 1000B are composed of a plurality of components and such components are then coupled together to form the complete electrical component delivery device 902 shown in FIG. 9.

Wire positioner 904 is configured to hold and/or position a portion of a wire, such as a portion of wire 906. Wire 906 may also, additionally or alternatively, be at least partially disposed within the wire channel. During processing, solder sleeve 908 may be disposed on wire 906. In certain examples, solder sleeve 908 is, for example, threaded onto wire 906.

FIGS. 10-13 illustrate electrical component delivery device portion 1000A with a body 1020, a wire channel 1008 with wire channel entry 1024 and wire channel exit 1010, and fluid guides 1022A and 1022B (shown as shaded channels in FIGS. 10-13). FIGS. 10-13 illustrate views of an electrical component delivery device portion 1000A from different viewpoints. Wire channel 1008 and/or fluid guides 1022A and/or 1022B are disposed within a portion of body 1020. Accordingly, body 1020 may be, for example, made from any suitable material such as a metal (e.g., steel, aluminum, titanium, cooper, brass, nickel, and/or another metal), a plastic, glass, and/or another such material appropriate for receiving a wire and receiving the fluid (e.g., is non-reactive with the fluid). Wire channel 1008 and fluid guides 1022A and/or 1022B may be machined, cast, molded, cut, 3D printed, and/or otherwise formed into body 1020.

In certain examples, body 1020 may fully enclose all or a portion of the wire channel of electrical component delivery device 902. In the example shown in FIGS. 10-13, where body 1020 is approximately one half of electrical component delivery device 902, wire channel 1008 accordingly forms approximately half of the wire channel of the electrical component delivery device 902. In certain examples the wire channel 1008 is configured to receive wire 906 through wire channel entry 1024 and allow wire 902 to be threaded through the wire channel 1008. In certain additional examples, the wire channel 1008 is configured to allow an electrical component (e.g., solder sleeve 908) to pass through wire channel exit 1010 of wire channel 1008.

In the example shown in FIGS. 10-13, fluid guide 1022A includes guide entry 1002A, guide fluid channel 1004A, and guide exits 1006A-1 and 1006A-2. Fluid guide 1022B includes guide entry 1002B, guide fluid channel 1004B, and guide exits 1006B-1 and 1006B-2.

In certain examples, guide entries 1002A and 1002B are fluidically connected to guide fluid channels 1004A and 1004B and/or guide exits 1006A-1 (not shown in FIG. 10, but shown in FIGS. 11 and 12) and 1006A-2, and/or 1006B-1 and 1006B-2, respectively (e.g., a fluid such as a gas and/or a liquid may flow through such components). Guide fluid channels 1004A and 1004B connects guide entries 1002A and 1002B and guide exits 1006A-1 and 1006A-2, and 1006B-1 and 1006B-2, respectively. As such, for example, fluid may enter through guide entry 1002A, flow through guide fluid channel 1004A, and exit through guide exits 1006A-1 and/or 1006A-2. Examples of fluids may include liquids (e.g., water, machining fluids, and/or other fluids) and gases (e.g., air such as compressed air, inert gas, nitrogen, and/or other such gases).

Guide fluid channels 1004A and 1004B fluidically connect guide entries 1002A and 1002B to guide exits 1006A-1 and 2 and 1006B-1 and 2, respectively. In certain examples, guide fluid channels may be straight, curved, and/or other geometries. In certain such examples, guide fluid channels (as well as, possibly, guide entries and/or guide exits) may be smoothly shaped (e.g., may include a substantially smooth cross section) to minimize pressure drop of fluids flowing within guide fluid channels (as well as, possibly, guide entries and/or guide exits).

Figure 12:
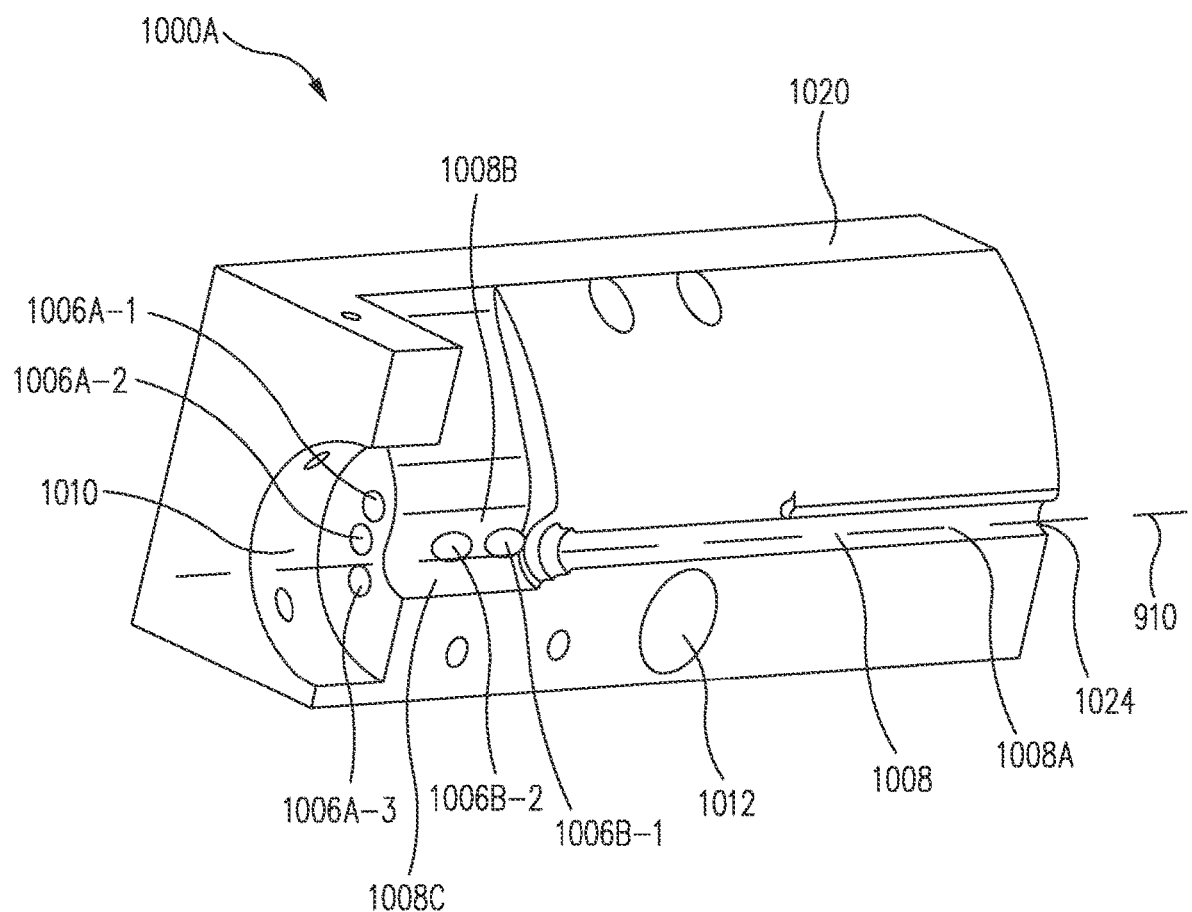
FIG. 12 illustrates a view of a portion of an electrical component delivery device in accordance with an example of the disclosure.
Figure 13:
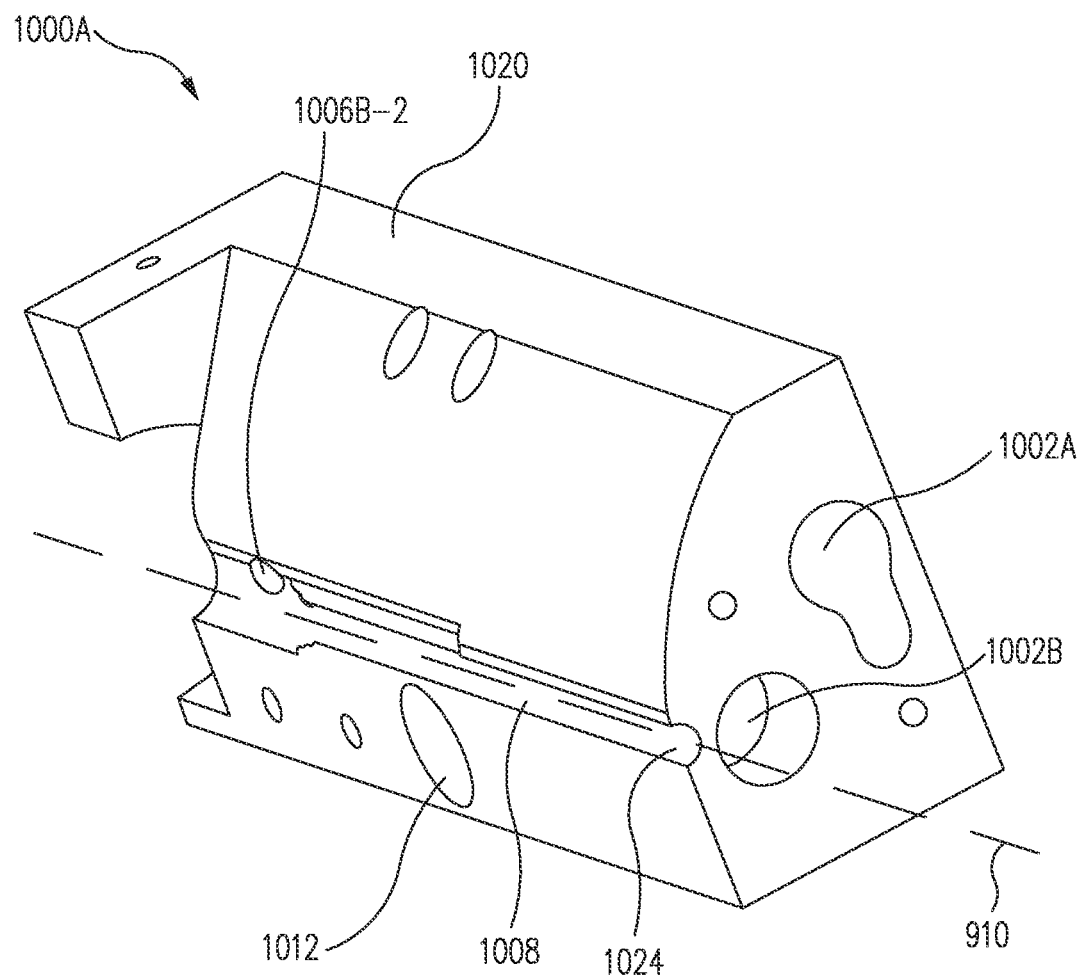
FIG. 13 illustrates another view of a portion of an electrical component delivery device in accordance with an example of the disclosure.

Guide exits 1006A-1, 1006A-2, 1006B-1, and/or 1006B-2 are configured to allow such fluids to exit into a portion of wire channel 1008. In certain examples, guide exits 1006A-1, 1006A-2, 1006B-1, and/or 1006B-2 may allow fluids to exit into different portions of wire channel 1008 and/or may exit in different directions. For example, in FIGS. 10-13, wire channel 1008 includes channel sections 1008A-C, as shown in FIG. 12. No fluid is delivered into channel section 1008A while fluid is delivered to channel section 1008B and 1008C. Thus, the cross-sectional area of channel section 1008A is different from the cross-sectional area of channel sections 1008B and 1008C to accommodate the volume of fluid introduced into channel sections 1008B and 1008C. Guide exit 1006B-1 delivers fluids into channel section 1008B while guide exit 1006B-2 delivers fluids into channel section 1008C. Channel section 1008B is positioned before (e.g., as determined by the direction that an electrical component such as a solder sleeve 908 would travel on the wire 906 held within electrical component delivery device portion 1000A) channel section 1008C and so guide exit 1006B-2 is configured to deliver fluid to a portion of wire channel 10008 before where guide exit 1006B-2 is configured to deliver fluid to. Additionally, guide exits 1006B-1 and 1006B-2 deliver fluids into wire channel 1008 before guide exits 1006A-1 and 1006A-2.

In FIGS. 10-13, guide exits 1006B-1 and 1006B-2 are configured to deliver fluids at an angle to axis 910. Guide exits 1006A-1 and 1006A-2 are configured to deliver fluids parallel or substantially parallel to the direction of axis 910. In certain such examples, the guide exits may be staggered and/or spaced apart so that fluid flow from a first guide exit may be configured to move the electrical component before dissipating and then fluid flow from a second guide exit may be configured to continue moving the electrical component. Thus, staggered guide exits may allow for more efficient use of the fluid in moving the electrical component and/or may allow for the guide exits to have a greater total surface area and thus offer less flow resistance to the fluid.

While FIGS. 10-13 illustrate example electrical component delivery device portion 1000A with fluid guides 1022A and 1022B, other examples of electrical component delivery devices may include any number of fluid guides, including one, two, three, four, or five or more fluid guides. Each of such fluid guides may include any number of guide entries, guide fluid channels, and guide exits.

In certain examples, a connector guide 1026 (shown in FIG. 10) fluidically connects at least a portion of guide fluid channels 1004A and 1004B. As such, fluid flow (e.g., compressed airflow) is shared between guide fluid channels 1004A and 1004B and so only one of guide entries 1002A or 1002B may need to be connected to a fluid source for both fluid channels 1004A and 1004B to receive the fluid.

Wire channel exit 1010 is disposed on one end of the body 1020. In certain examples, wire channel exit 1010 includes at least a first section 1010A and a second section 1010B. In certain such examples, one of the first section 1010A and/or the second section 1010B is disposed at a mouth of the wire channel exit 1010 and the other of the first section 1010A and/or the second section 1010B is disposed within an interior portion of body 1020. A cross-sectional area of the second section 1010B may be different than a cross-sectional area of the first section 1010A. In the example shown in FIGS. 10-13, the second section 1010B is the section disposed at the mouth of wire channel exit 1010 and the cross-sectional area of the second section 1010B is smaller than the cross-sectional area of the first section 1010A. Also, the cross-sectional area of the first section 1010A smoothly tapers into the cross-sectional area of the second section 1010B. As such, the second section 1010B may aid in holding and/or positioning the wire and/or the electrical component.

FIG. 11 may further illustrate a view of electrical component delivery device portion 1000A that shows that guide exits 1006B-1 and 1006B-2 of electrical component delivery device portion 1000A deliver fluids at an angle to axis 910 while guide exits 1006A-1, 1006A-2, and 1006A-3 deliver fluids parallel or substantially parallel to the direction of axis 910. As such, fluid delivered through guide exits 1006A-1, 1006A-2, and 1006A-3 may provide thrust that may aid in moving the electrical component (e.g., solder sleeve 908) as the electrical component is exiting through wire channel exit 1010.

While the example shown in FIGS. 10-13 include five guide exits, certain other examples may include different amounts of guide exits (e.g., one, two, three, four, five, six, seven, or eight or more) disposed within electrical component delivery device portion 1000A and configured to delivery fluids to different portions of electrical component delivery device portion 1000A.

In certain examples, a complete electrical component delivery device may include one or more openings 1012. Opening 1012 of electrical component delivery device portion 1000A allows a connecting mechanism (e.g., a bolt, a snap, and/or other such mechanism) to pass through to couple together a plurality of components of the complete electrical component delivery device.

Guide entries 1002A and 1002B include fluid source receivers 1028A and 1028B, respectively, as shown in FIG. 11. Fluid source receivers 1028A and 1028B are configured to couple to one or more fluid sources (e.g., a plurality of fluid sources of the same type of fluid or a plurality of fluid sources of different fluids). The one or more coupled fluid sources may deliver fluid through guide entries 1002A and 1002B via fluid source receivers 1028A and 1028B. In certain examples, fluid source receivers 1028A and 1028B may include fittings, threads, snap features, and/or other components and/or features that may be configured to receive a corresponding feature (e.g., hose) of a fluid source and, thus, receive, fluid from the fluid source. Such features may be configured to receive a plurality of different sized fittings of the fluid source by, for example, tapered fittings, adjustable size fittings, deformable seals, and/or other features. In certain such examples, such features may result in an airtight seal between the fluid source and fluid source receivers 1028A and 1028B.

Figure 14:
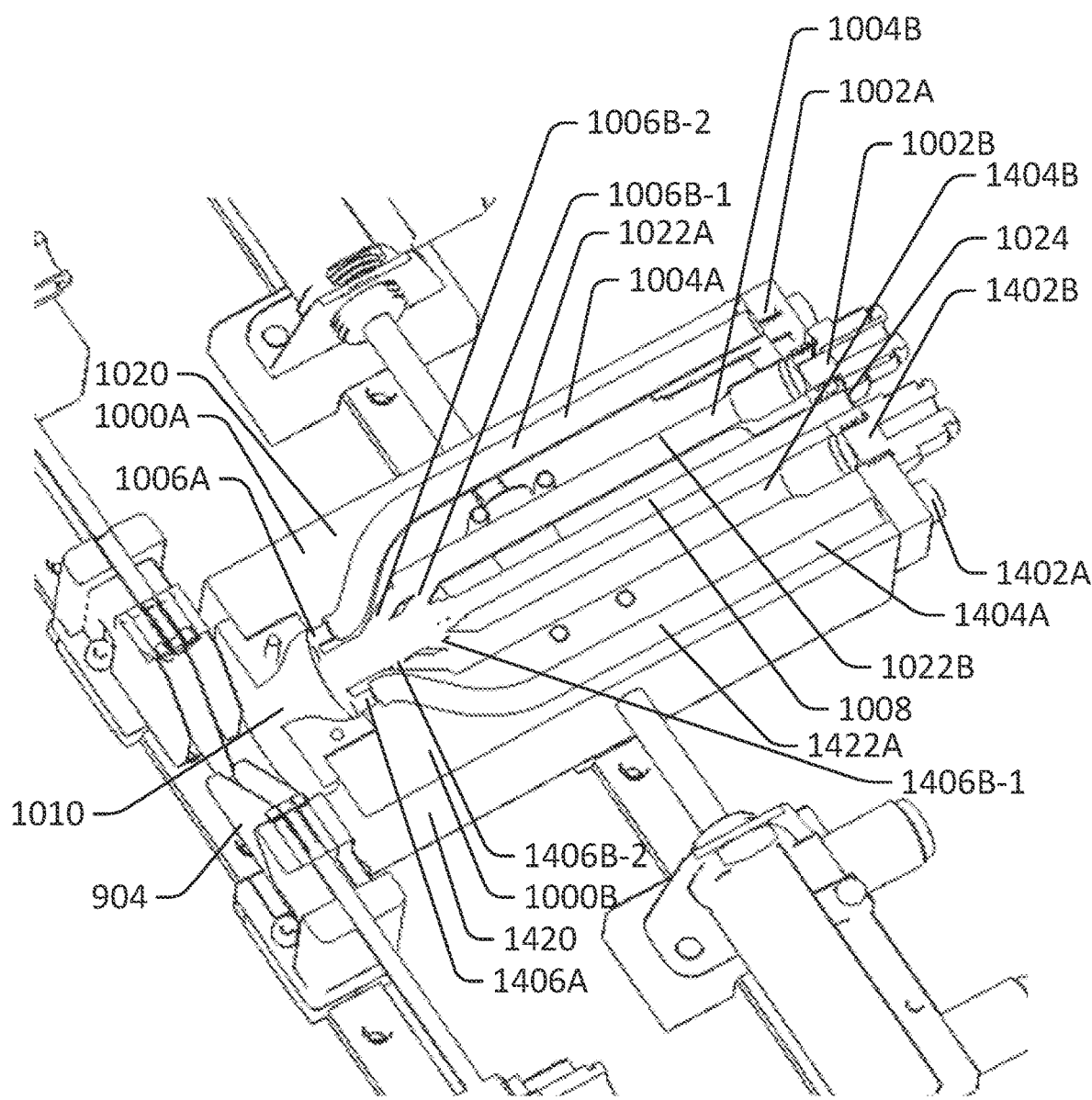
FIG. 14 illustrates a cutaway view of a wire processing system with an electrical component delivery device in accordance with an example of the disclosure.

FIG. 14 illustrates a cutaway view of the electrical component delivery system 900 shown in FIG. 9.

As shown in FIG. 14, electrical component delivery device portion 1000A includes at least some of the features detailed in FIGS. 9-13. For example, electrical component delivery device portion 1000A includes body 1020, wire channel 1008 (which may be defined by features of both electrical component delivery device portion 1000A and electrical component delivery device portion 1000AB), and fluid guides 1022A and 1022B (each of which may include, respectively, guide entries 1002A and 1002B, guide fluid channels 1004A and 1004B, and guide exits 1006A and 1006B-1 and 1006B-2).

Electrical component delivery device portion 1000B includes corresponding features (e.g., is a mirrored version of first electrical component delivery device portion 1000A). Accordingly, electrical component delivery device portion 1000B includes body 1420 and fluid guides 1422A and 1422B (each of which may include, respectively, guide entries 1402A and 1402B that include fluid source receivers 1428A and 1428B, respectively, guide fluid channels 1404A and 1404B, and guide exits 1406A and 1406B-1 and 1406B-2) that may be mirrored versions of the respective components of electrical component delivery device portion 1000A. Other examples of electrical component delivery devices may include other features.

Electrical component delivery devices 1000A and 1000B, when assembled, are configured to move an electrical component (e.g., solder sleeve 908) threaded onto a wire 906 (held by, for example, wire positioner 904) through the use of one or more fluids (e.g., compressed air). Thus, the one or more fluids, which may include compressed air and other fluids, may travel through the fluid guides to push against the electrical component to move the electrical component along the wire 906, as described above.

In certain examples, such as the example shown in FIG. 10, fluid guides 1022A and 1022B are fluidically separate from guide entry to guide exit. As such, fluid guides 1022A and 1022B receives fluid from different sources and/or includes separate guide entries. Other examples fluidically connect the fluid guides so that the fluid guides may share fluid sources.

While the example shown in FIG. 10 includes a central wire channel 1008 with fluid guides disposed around wire channel 1008, other examples may dispose the fluid guides asymmetrically. Such asymmetrical fluid guide configurations may, for example, be useful in moving electrical components that are also asymmetrical. In such components, the wire channel may also be configured to hold such electrical components in a desired orientation (e.g., the wire channel may include a cross section that is configured to hold the electrical components in the desired orientation.) In other examples, wire channel 1008 may be configured to hold electrical components in a desired orientation even if the electrical component is symmetrical.

Figure 15:
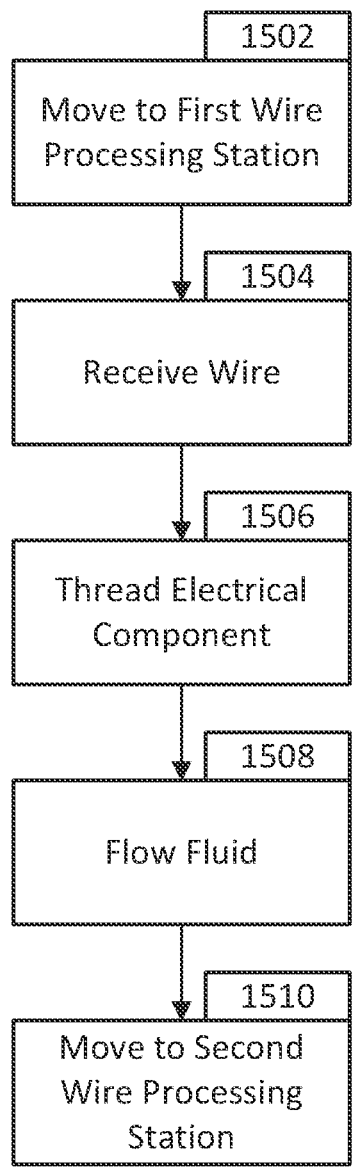
FIG. 15 is a flowchart detailing wire processing using the electrical component delivery device in accordance with an example of the disclosure.

FIG. 15 is a flowchart detailing wire processing using the electrical component delivery device in accordance with an example of the disclosure. In block 1502, a wire transport is moved to a first wire processing station. The wire transport may include a wire received at a previous wire processing station.

In block 1504, the first wire processing station receives the wire held by the wire transport. For example, the wire is received by and/or within a wire channel of an electrical component delivery device. The wire channel may position the wire for further processing. In certain other examples a wire positioner may position and/or aid in positioning the wire within the electrical component delivery device.

In block 1506, an electrical component (e.g., a solder sleeve) is threaded onto the wire. In certain examples, the electrical component may be threaded onto the wire at the first wire processing station, while other examples may thread the electrical component at a different wire processing station.

In block 1508, fluid is flowed through one or more fluid guides of the electrical component delivery device to contact the electrical component to move the electrical component along the wire. In certain examples, the fluid exits through the one or more fluid guides into the wire channel and moves and/or positions (e.g., propels) the electrical component on the wire. In certain examples, the first wire processing station may include addition features to slow and/or stop the electrical component at a previously determined position on the wire. In other examples, delivery of the fluid may be calibrated (e.g., a set volume of fluid and/or a set pressure may be delivered) such that the electrical component will come to a stop on the wire within a predetermined area.

After the electrical component has been positioned in block 1508 by flowing of fluid, the wire transport, with the wire is moved from the first wire processing station to the second wire processing station.

Accordingly, after the electrical component has been moved on the wire by the electrical component delivery device 900 at station 104 and stripped at station 106, the wire transport 200 then carries the wire 908 to solder sleeve positioning station 108 and the solder sleeve positioning station 108 then positions the electrical component in a desired region along the length of the wire 906 (e.g., over a stripped portion of the wire 906) for further processing.

Figure 16:
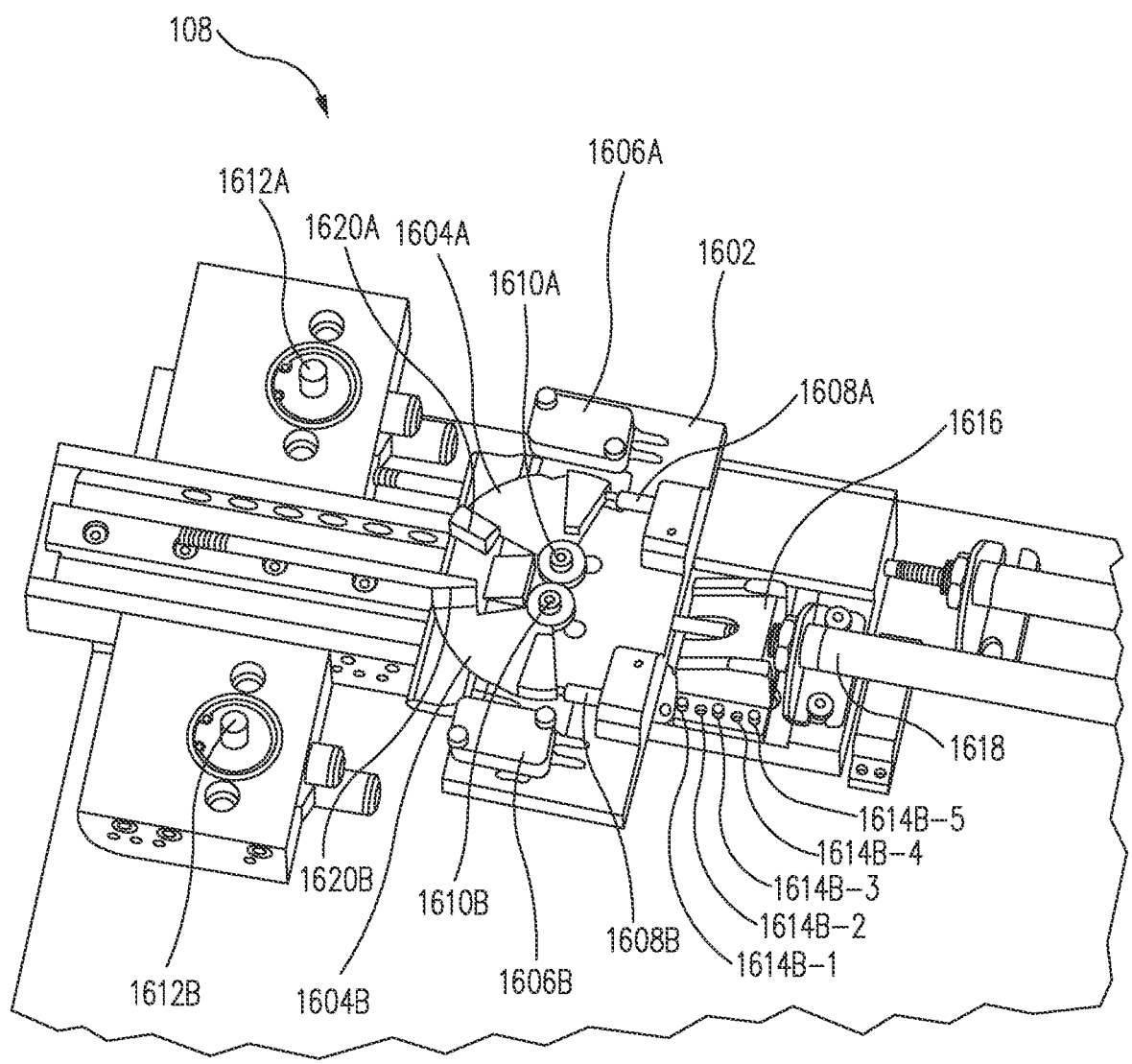
FIG. 16 illustrates a solder sleeve positioning station in accordance with an example of the disclosure.

Such a solder sleeve positioning station 108 is illustrated in FIG. 16. While the solder sleeve positioning station 108 is described with reference to positioning a solder sleeve 908 on wire 906, it is appreciated that similar stations may be used to position other electrical components on wire 908.

Broadly, solder sleeve positioning station 108 may operate within a system as follows. The wire transport 200 holding wire 906 with solder sleeve 908 first moves alongside the solder sleeve positioning station 108 and wire retainers 206A-C of wire transport 200 are compressed by being pushed against wire positioner 904 (e.g., by moving wire transport 200 towards solder sleeve positioning station 108 and/or by moving solder sleeve positioning station 108 towards wire transport 200). The wire 906 is inserted into the solder sleeve positioning station 108 and is positioned between solder sleeve pinchers 1604A and 1606B (shown in FIG. 18) of solder sleeve positioning station 108. After the wire 906 has been inserted, the solder sleeve positioning station 108 may first grasp the wire 906 and/or the solder sleeve 908 at a first pincher position. If the solder sleeve positioning station 108 determines that it is grasping the wire 906, the solder sleeve positioning station then holds the wire 906 and moves to a second pincher position, thus moving the wire 906 a distance equal to the difference between the distance between the first pincher position and the second pincher position. The solder sleeve positioning station 108 can thus pull or push the wire 906 in such a manner until determining that it is grasping the solder sleeve 908.

Upon determining that the solder sleeve pinchers 1604A and 1604B of the solder sleeve positioning station 104 is grasping the solder sleeve 908, the solder sleeve pinchers 1604A and 1604B then holds the solder sleeve 908 and moves to the third pincher position. The third pincher position is calculated to correspond with the stripped portion of the wire 906. In certain examples, the solder sleeve pinchers 1604A and 1604B may linearly move between the first pincher position, the second pincher position, and the third pincher position. After the solder sleeve 908 has been moved to the stripped portion of the wire 906, the wire transport 200 may move away from the solder sleeve positioning station 104 and thus pull the wire 906 away.

The solder sleeve positioning station 108 includes a sliding platform 1602, a pair of solder sleeve pinchers 1604A and 1604B, a pair of pincher sensors 1606A and 1606B, a pair of actuators 1608A and 1608B, a pair of sliding posts 1612A and 1612B, posts 1614A-1-5 (not shown in FIG. 16, but shown in FIGS. 18-22) and 1614B-1-5, a sliding base 1616, and a positioning wire guide 1618.

Solder sleeve pinchers 1604A and/or 1604B includes pinching portions 1620A and/or 1620B configured to hold a wire 906 and/or a solder sleeve 908. Solder sleeve pinchers 1604A and/or 1604B may be configured to move between, at least, the first pincher position, the second pincher position, and the third pincher position, as well as, possibly, other pincher positions.

Figure 18:
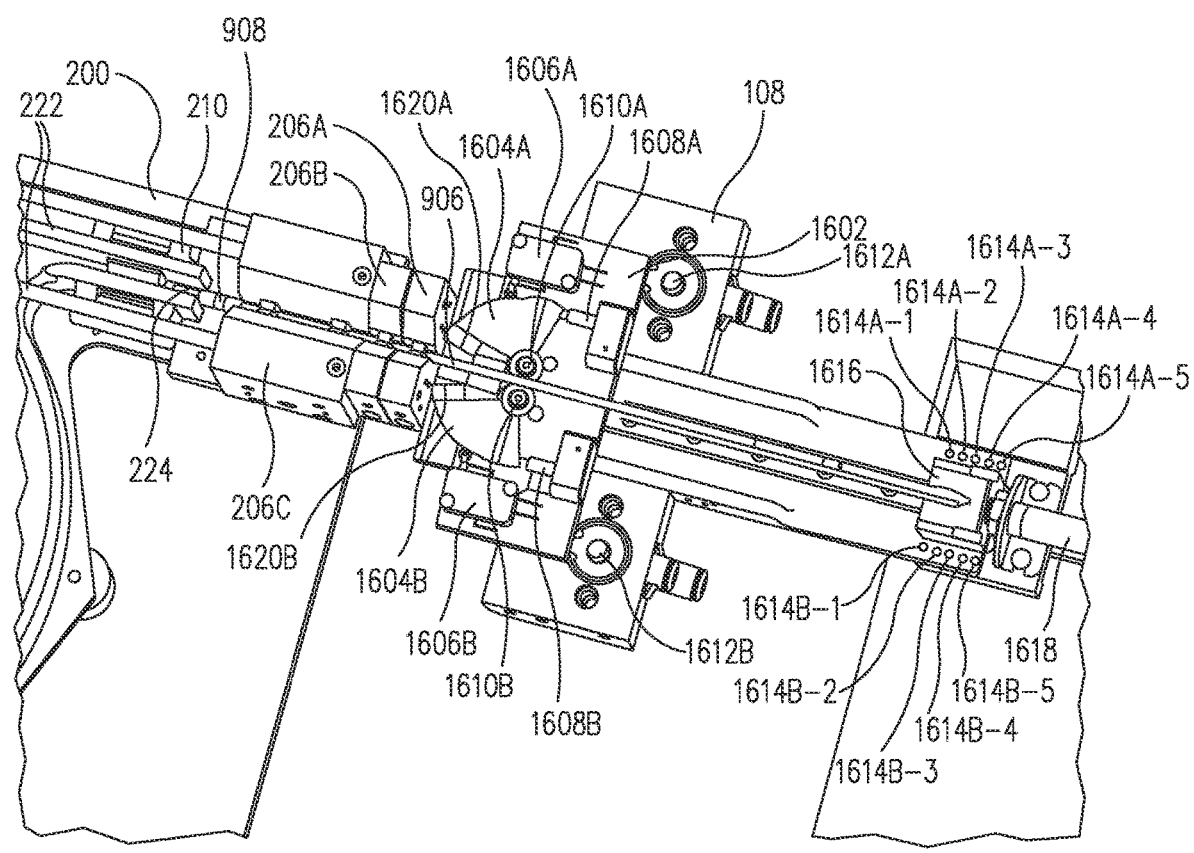
FIGS. 18-22 illustrate perspective views of a solder sleeve positioning station in accordance with an example of the disclosure.
Figure 19:
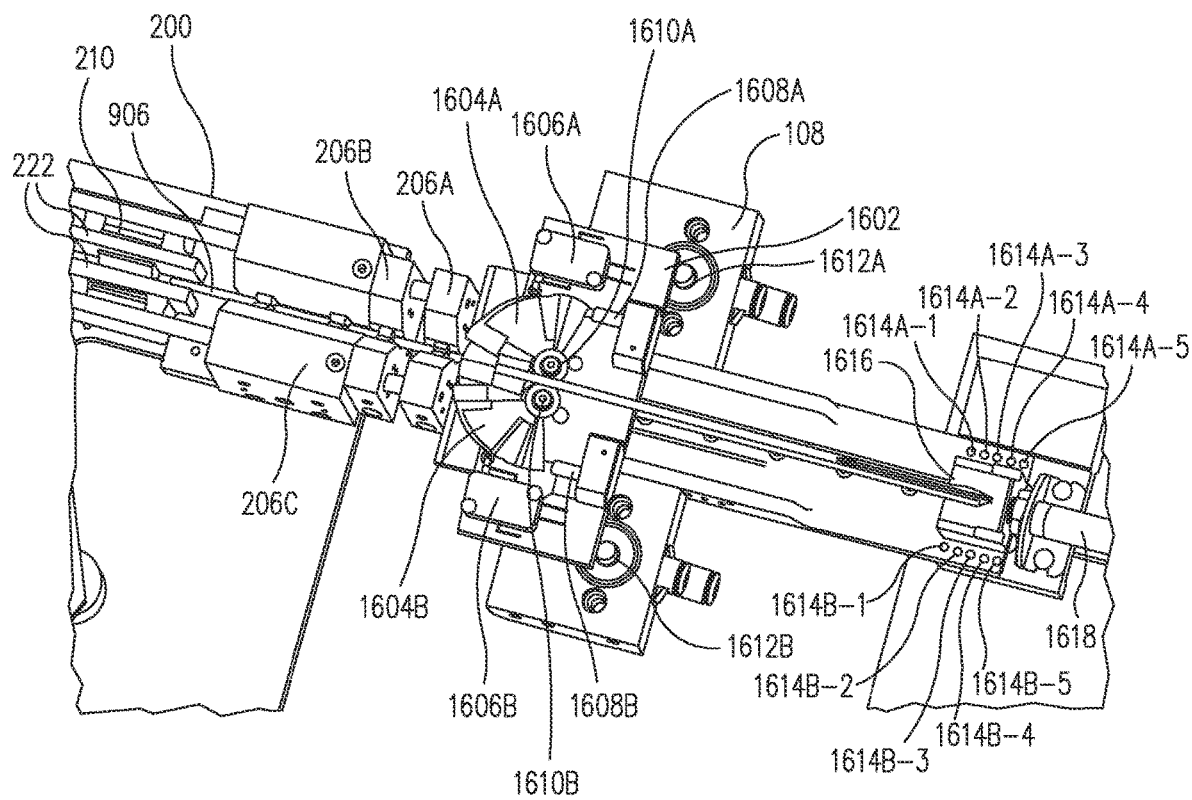
Figure 20:
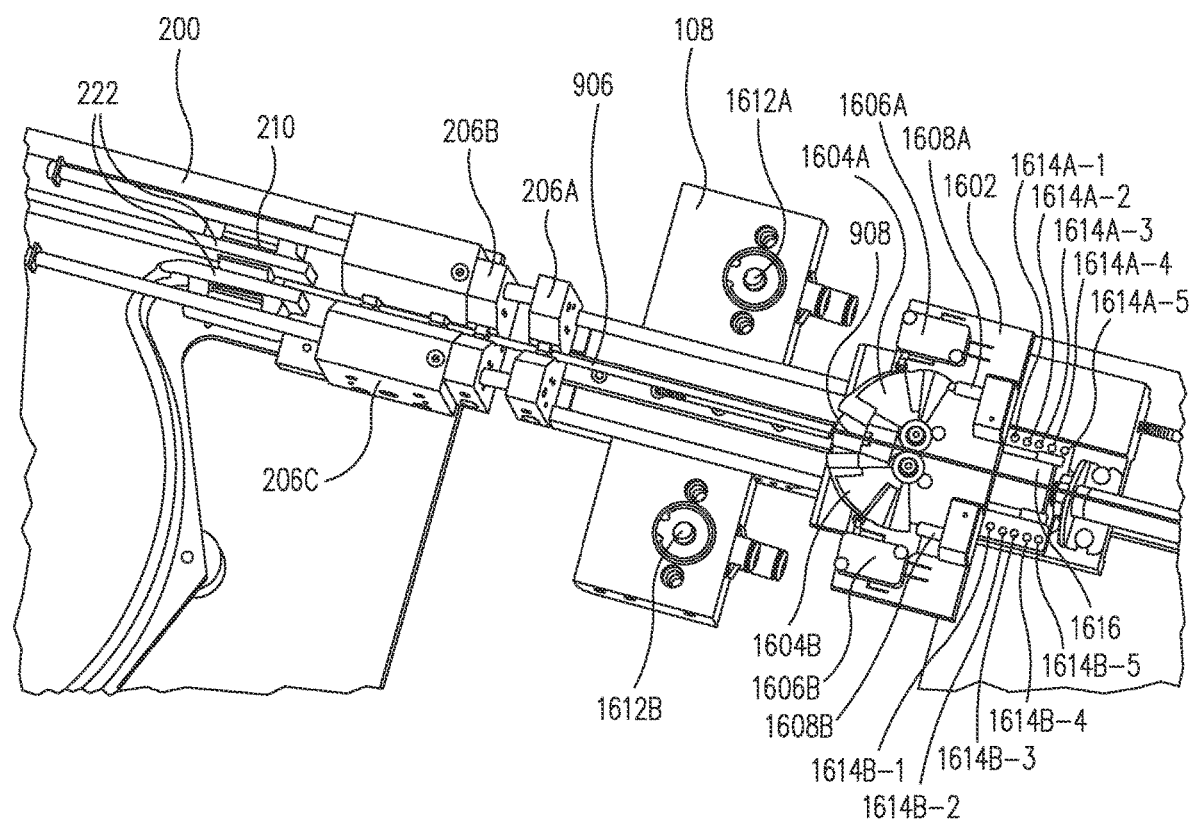

As described herein, the first pincher position is an initial position that the solder sleeve pinchers 1604A and/or 1604B first receives the wire and/or solder sleeve. FIG. 18 shows the solder sleeve pinchers 1604 and 1604B in the first pincher position. The second pincher position is a position that solder sleeve pinchers 1604A and/or 1604B would move to after detecting that the solder sleeve pinchers 1604A and/or 1604B are holding the wire 906 (e.g., after receiving the wire 906 in the first pincher position). FIG. 19 shows the solder sleeve pinchers 1604 and 1604B in the second pincher position. The third pincher position or "processing position" is a position that solder sleeve pinchers 1604A and/or 1604B would move to after detecting that the solder sleeve pinchers 1604A and/or 1604B are holding the solder sleeve 908 and is calculated to correspond to a stripped portion on the wire 906. Thus, if it is detected that solder sleeve pinchers 1604A and/or 1604B are holding the solder sleeve 908 in the first pincher position, solder sleeve pinchers 1604A and/or 1604B can then move to the third pincher position. FIGS. 19 and 20 show the solder sleeve pinchers 1604 and 1604B in the third pincher position. In certain examples, solder sleeve pinchers 1604A and/or 1604B may be configured to translate and/or rotate to move between the pincher positions and/or to hold and/or grasp the wire 906 and/or solder sleeve 908.

Pincher sensors 1606A and 1606B are coupled to solder sleeve pinchers 1604A and 1604B, respectively, in FIG. 16. Pincher sensors 1606A and 1606B are configured to output sensor data associated with a position of solder sleeve pinchers 1606A and 1606B, respectively. In certain examples, such data may, for example, be associated with a rotational angle of solder sleeve pinchers 1604A and/or 1604B. For example, solder sleeve pinchers 1604A and/or 1604B may be configured to rotate until bottoming out on, i.e. moving until physically contacting, an item. In the example shown in FIG. 16, pincher sensors 1606A and 1606B are configured to output data associated with the rotational angle of solder sleeve pinchers 1604A and 1604B, respectively. If solder sleeve pinchers 1604A and/or 1604B bottom out at a first angle (e.g., an angle indicating that solder sleeve pinchers 1604A and 1604B are holding an item that is approximately the thickness of a wire), pincher sensors 1606A and/or 1606B may then output data indicating that solder sleeve pinchers 1604A and/or 1604B may be holding an item of approximately a first thickness. Such an item may be, for example, the wire 906. If solder sleeve pinchers 1604A and/or 1604B bottom out at a second angle (e.g., an angle indicating that solder sleeve pinchers 1604A and 1604B are holding an item that is approximately the thickness of a solder sleeve), pincher sensors 1606A and/or 1606B may output data indicating that solder sleeve pinchers 1604A and/or 1604B may be holding an item of approximately a second thickness. Such an item may be, for example, a solder sleeve 908 or other electrical component.

Actuators 1608A and/or 1608B are coupled to solder sleeve pinchers 1604A and/or 1604B, respectively. In certain examples, linear movement of a portion of actuators 1608A and/or 1608B is received by solder sleeve pinchers 1604A and/or 1604B and converted to rotation of solder sleeve pinchers 1604A and/or 1604B. For examples, a portion of actuators 1608A and/or 1608B (e.g., a cylinder and/or rod configured to translate) is configured to translate between, at least, a first linear position and a second linear position to rotate the solder sleeve pinchers 1604A and/or 1604B around rotational axes 1610A and/or 1610B, respectively. As such, the first linear position may correspond to a first rotational angle of the solder sleeve pinchers 1604 and/or 1604B and the second linear position may correspond to a second rotational angle of the solder sleeve pinchers 1604A and/or 1604B. In other examples, solder sleeve pinchers 1604A and/or 1604B may be moved through techniques alternative or additional to movement via linear actuators 1608A and/or 1608B.

In certain examples, solder sleeve pinchers 1604A and/or 1604B are configured to translate between a plurality of linear positions. In certain such examples, solder sleeve pinchers 1604A and/or 1604B may include and/or may be coupled to sliding platform 1602. In such examples, sliding platform 1602 is configured to, at least, translate between a plurality of linear positions. For example, sliding platform 1602 may be configured to linearly translate to move the solder sleeve pinchers 1604A and/or 1604B between the first pincher position, the second pincher position, and/or the third pincher position.

In certain examples, one or more of such pincher positions may be adjustable. For example, in FIG. 16, posts 1614A-1-5 and 1614B-1-5 allow for the third pincher position to be adjusted. In the example shown in FIG. 16, sliding platform 1602 is configured to bottom against one or more posts 1614A-1-5 and 1614B-1-5 when in the third position. In the example shown, one of more posts 1614A-1-5 and/or 1614B-1-5 may be moved, removed, and/or added to change the position that sliding platform 1602 bottoms against to change the position of the third pincher position. Certain other examples may use other features and/or techniques (e.g., shims, adjustable tensions on guide wires, and/or other such adjustments) to change the position of one or more of the pincher positions.

In certain examples, sliding platform 1602 is configured to contact sliding base 1616 when in the third pincher position. As such, position adjusters 1614A and 1614B allow for adjustment of sliding base 1616 and, thus, adjustment of the position where sliding platform 1602 bottoms against sliding base 1616 and, accordingly, adjustment of the third pincher position.

Alternatively or additionally, sliding posts 1612A and/or 1612B may also control the position of sliding platform 1602. For example, sliding posts 1612A and/or 1612B may be configured to move between at least a first post position and a second post position (e.g., an extended second post position and a retracted first post position). In certain such examples, the first post position allows sliding platform 1602 to move from one side of sliding posts 1612A and/or 1612B to the other side. The second post position prevents sliding platform 1602 from moving from one side of sliding posts 1612A and/or 1612B to the other side. In certain such examples, sliding posts 1612A and/or 1612B, in the second post position, are configured to contact a sliding platform 1602 attempting to move from one side of sliding posts 1612A and/or 1612B to another side to prevent movement of sliding platform 1602 from one side of sliding posts 1612A and/or 1612B to the other side. As such, sliding posts 1612A and/or 1612B may, in the second post position, be configured to prevent sliding platform 1602 from moving between the first pincher position and the second and third pincher position.

Positioning wire guide 1618 is configured to hold at least a portion of a wire and position the wire 906. As such, positioning wire guide 1618, in certain examples, is configured to hold the wire 906 in a position so that solder sleeve pincher 1604A and/or 1604B may grasp, hold, and/or move the wire 906.

In certain examples, solder sleeve positioning station 108 is controlled by one or more controllers (e.g., controller 112). Such controllers may provide instructions for operation of, at least, solder sleeve positioning station 108. The controller 112 may include, for example, a single-core or multi-core processor or microprocessor, a microcontroller, a logic device, a signal processing device, memory for storing executable instructions (e.g., software, firmware, or other instructions), and/or any elements to perform any of the various operations described herein. In various examples, the controller 112 and/or its associated operations may be implemented as a single device or multiple devices (e.g., communicatively linked) to collectively constitute the controller 112.

The controller 112 may include one or more memory components or devices to store data and information. The memory may include volatile and non-volatile memory. Examples of such memories include RAM (Random Access Memory), ROM (Read-Only Memory), EEPROM (Electrically-Erasable Read-Only Memory), flash memory, or other types of memory. In certain examples, the controller 112 may be adapted to execute instructions stored within the memory to perform various methods and processes described herein.

Figure 17:
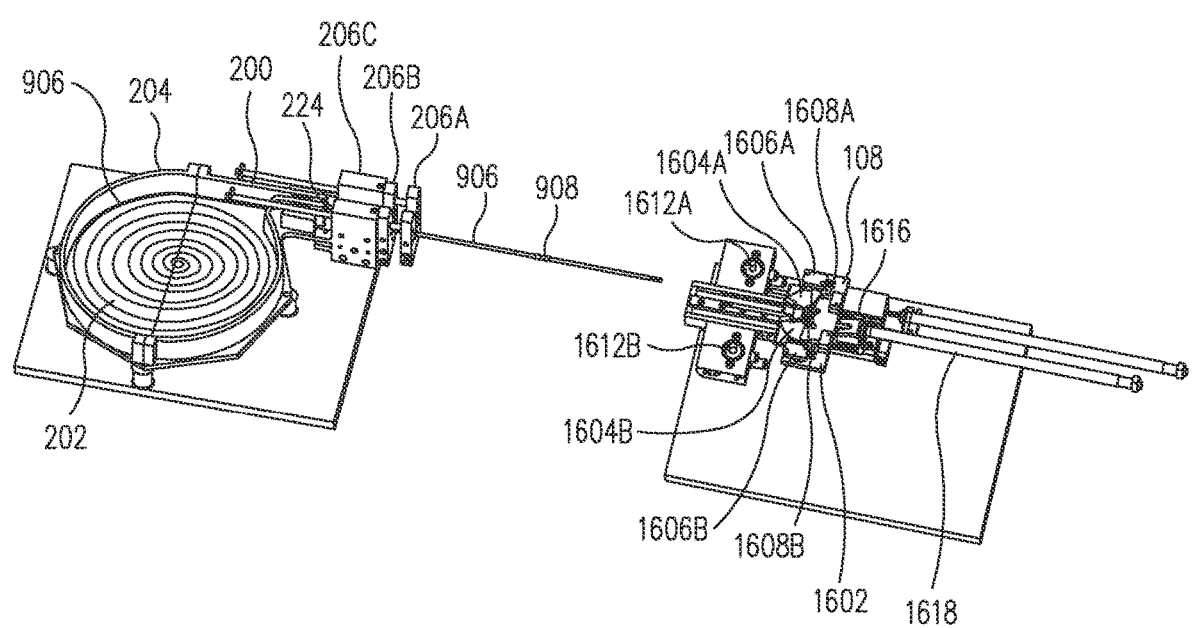
FIG. 17 illustrates a wire transport and a solder sleeve positioning station in accordance with an example of the disclosure.

FIG. 17 illustrates a wire transport 200 and a solder sleeve positioning station 108 in accordance with an example of the disclosure. As shown in FIG. 17, wire transport 200 is configured to interface with solder sleeve positioning station 108. As such, wire transport 200 may hold a wire, such as wire 906, and wire 906 may be received by solder sleeve positioning station 108. In certain examples, the wire 906 may include a solder sleeve 908 coupled to the wire when wire transport 200 is received by solder sleeve positioning station 108.

In certain examples, wire transport 200 includes, for example one or more wire retainers 206A-C. Such wire retainers 206A-C may be collapsible (e.g., may be configured to move between a plurality of positions), as described herein. Interfacing wire transport 200 with solder sleeve positioning station 108 may include such wire retainers 206A-C moving to a retracted position (from, e.g., an extended position) to, for example, expose a portion of the wire 906 held by wire transport 200 so that solder sleeve positioning station 108 receives wire 906. In certain such examples, the exposed portion of wire 906 may include a solder sleeve 908.

FIGS. 18-22 illustrate perspective views of a solder sleeve positioning station 108 in accordance with an example of the disclosure. FIG. 18 includes wire transport 200 and solder sleeve positioning station 108. In FIG. 18, wire 906 held by wire transport 200 has been inserted into solder sleeve positioning station 108, but solder sleeve pinchers 1604A and 1604B have not yet grasped wire 906. Accordingly, in FIG. 18, wire transport 200 is interfacing with solder sleeve positioning station 108. As such, wire retainers 206A-C may be in a retracted position. Wire retainers 206A-C may be in the retracted position due to, for example, wire transport 200 and/or solder sleeve positioning station 108 pushing against each other (e.g., contacting each other). As such, a portion of wire 906 held by wire transport 200 is exposed and may be received by solder sleeve positioning station 108. Such exposed portion may include a solder sleeve 908 (shown enlarged and not to scale in FIG. 17, threaded onto wire 906 in FIGS. 18, 21, and 22, and grasped by solder sleeve pinchers 1604A and 1604B in FIG. 20). In certain examples, the wire 906 may be positioned within the solder sleeve positioning station 108 by positioning wire guide 1618.

In the example shown in FIG. 18, solder sleeve pinchers 1604A and/or 1604B are in the first pincher position. Solder sleeve pinchers 1604A and/or 1604B are open so that it is not yet grasping and/or holding wire 906. Additionally, sliding posts 1612A and/or 1612B are in the second post position to prevent sliding platform 1602 from moving to the third pincher position.

In FIG. 18, pincher sensors 1606A and/or 1606B and/or a controller communicatively connected to pincher sensors 1606A and/or 1606B may determine that solder sleeve pinchers 1604A and/or 1604B do not hold solder sleeve 908.

After determining that solder sleeve pinchers 1604A and/or 1604B are not holding a solder sleeve 908, solder sleeve pinchers 1604A and/or 1604B may then rotate (e.g., rotate around axis 1610A and/or 1610B, respectively) to grasp and/or hold wire 906, as shown in FIG. 19. In certain examples, solder sleeve pinchers 1604A and/or 1604B may be rotated by actuators 1608A and/or 1608B.

After grasping and/or holding wire 906, solder sleeve pinchers 1604A and/or 1604B and/or sliding platform 1602 may move from the first pincher position to the second pincher position. Solder sleeve pinchers 1604A and/or 1604B may then release wire 906 (e.g., by rotating back to the position shown in FIG. 18) and move back to the first pincher position. Solder sleeve pinchers 1604A and/or 1604B may continue to grasp and/or hold wire 906 at the first pincher position, move wire 906 to the second pincher position (e.g., by moving sliding platform 1602), release wire 906, and grasp and/or hold the wire 906 at the first pincher position until solder sleeve 908 has been detected to be held by solder sleeve pinchers 1604A and/or 1604B.

After a determination is made that solder sleeve pinchers 1604A and/or 1604B are grasping and/or holding solder sleeve 908, sliding posts 1612A and/or 1612B may be moved from a second post position to a first post position and sliding platform 1602 may then move to the third pincher position, as shown in FIG. 20. In certain examples, sliding platform 1602 may move to the third pincher position while solder sleeve pinchers 1604A and/or 1604B are grasping and/or holding solder sleeve 908. In certain examples, the third pincher position is a position defined by when sliding platform 1602 bottoms against (e.g., contacts) sliding base 1616. The sliding base 1616 is configured to attach to one or more position adjusters 1614A-1-5 and/or 1614B-1-5 and the position that the sliding base 1616 attaches to position adjusters 1614A-1-5 and/or 1614B-1-5 may be adjustable to adjust the third pincher position In certain examples, the third pincher position is a predetermined position where solder sleeve 908 may cover a stripped portion of wire 906. As such, when in such a position, solder sleeve 908 may be further processed to join with the stripped portion of wire 906. Accordingly, in certain examples, a processing station previous to solder sleeve positioning station 108, such as station 106, may strip wire 906, solder sleeve positioning station 108 may then position solder sleeve 908 over the stripped portion of wire 906, and solder sleeve 908 and wire 906 may be further processed at another station.

Additionally, in certain examples, solder sleeve 908 may be threaded onto a first pre-determined position and/or portion of wire 906 before processing by solder sleeve positioning station 108. Wire 906 may include a stripped portion at a second pre-determined position and/or portion. The first pre-determined position and/or portion may be different from the second pre-determined position and thus, solder sleeve 908 may need to be moved to the second pre-determined position and/or portion before further processing (e.g., soldering and/or heating of the solder sleeve 908).

The stripped portion may be stripped at a processing station previous to solder sleeve positioning station 108 (e.g., station 106). Accordingly, after grasping solder sleeve 908, it may be determined that the solder sleeve pinchers 1604A and/or 1604B are at the first pre-determined position. Solder sleeve pinchers 1604A and/or 1604B may then move to the second pre-determined position (e.g., it may move a distance equal to the distance between the first pre-determined position and the second pre-determined position).

In other examples, solder sleeve positioning station 108 first receives wire transport 200 in a position where the stripped portion is at a pre-determined distance relative to one or more features of solder sleeve positioning station 108. As the solder sleeve pinchers 1604A and/or 1604B grasp and move wire 906, the distance that wire 906 moves may be tracked by solder sleeve positioning station 108. Accordingly, the second pre-determined position (i.e. the position of the stripped portion) may be updated according to the distance moved. After solder sleeve pinchers 1604A and/or 1604B grasp and/or hold solder sleeve 908, solder sleeve 908 may be moved to the position of the stripped portion. In other examples, one or more sensors (e.g., a visual camera and/or other sensors) may track the position of the stripped portion. Solder sleeve 908 may then be moved to such a position.

Figure 21:
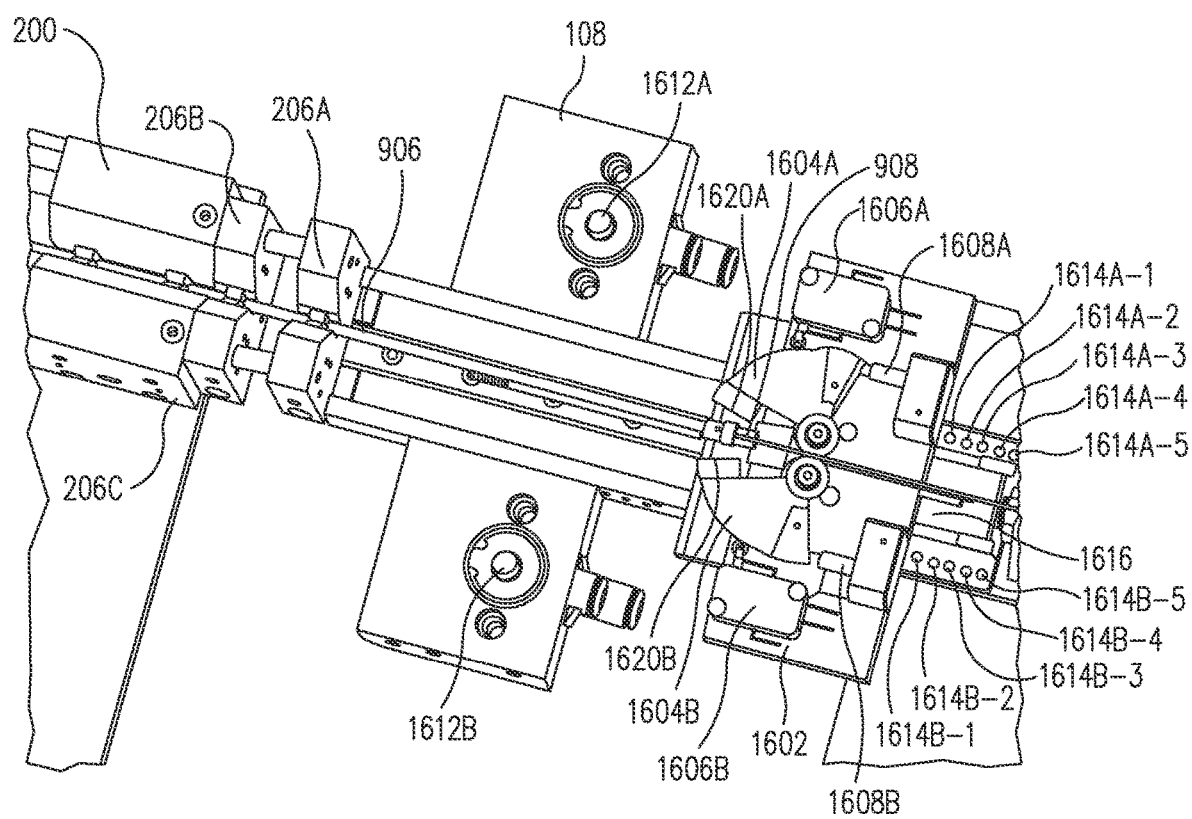
Figure 22:
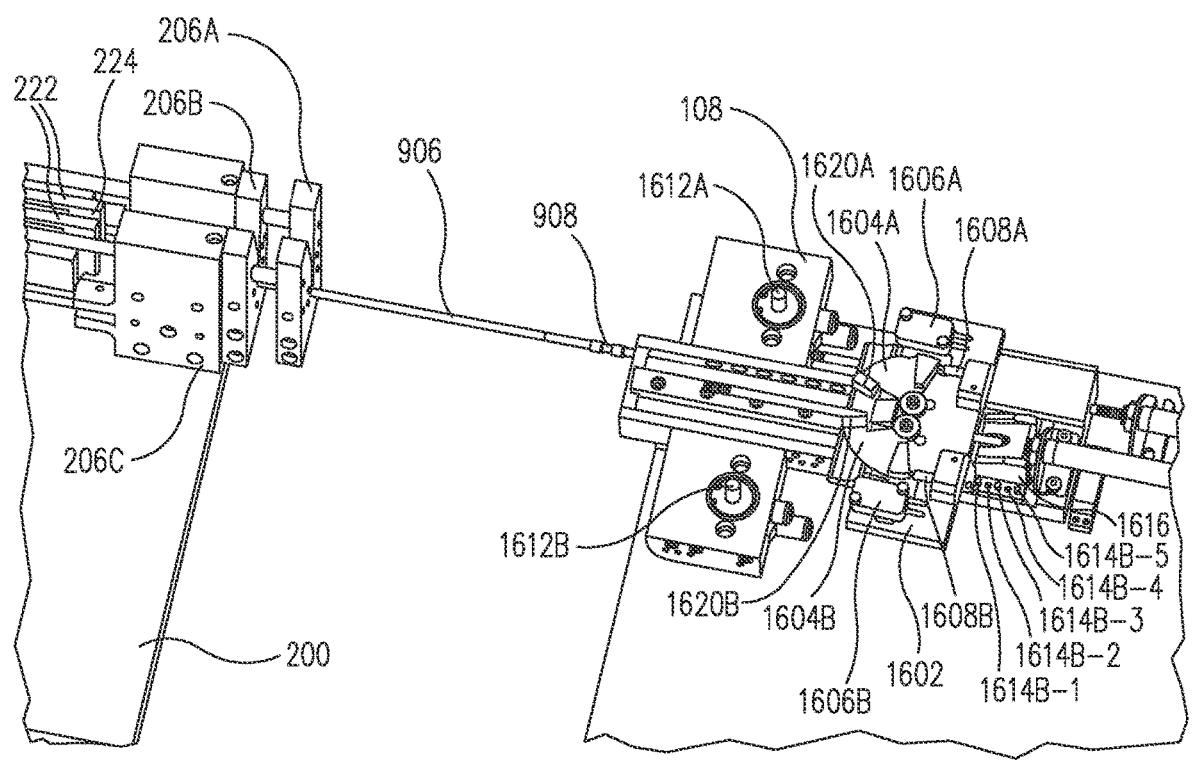

After solder sleeve 908 has been positioned over a portion of wire 906, solder sleeve pinchers 1604A and/or 1604B release solder sleeve 908, as shown in FIG. 21. Solder sleeve positioning station 108 and/or wire transport 200 then moves so that solder sleeve positioning station 108 does not contact wire 906 and/or solder sleeve 908 as shown in FIG. 22. Wire transport 200 may then move to another wire processing station for further wire processing.

Figure 23:
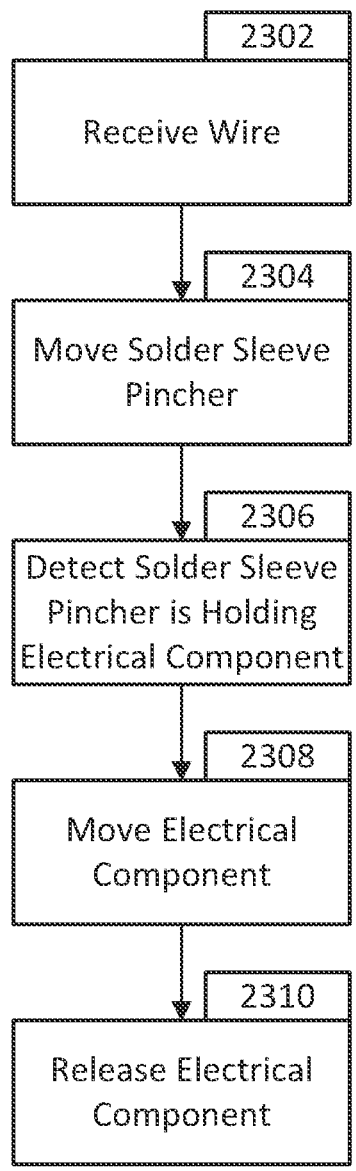
FIG. 23 is a flowchart detailing wire processing using the solder sleeve positioning station in accordance with an example of the disclosure.

FIG. 23 is a flowchart detailing wire processing using the solder sleeve positioning station in accordance with an example of the disclosure. In block 2302, a solder sleeve positioning station receives a wire. The wire may be held by a wire transport. The wire may be positioned by one or more features of the solder sleeve positioning station so that solder sleeve pinchers may receive and/or manipulate the wire. In certain such examples, the wire may include a solder sleeve and/or other electrical equipment that may be threaded onto the wire.

In block 2304, the solder sleeve pinchers of the solder sleeve positioning station move the wire. As such, the solder sleeve pinchers receives the wire in a first pincher position, holds the wire while moving from the first pincher position to a second pincher position, releases the wire at the second pincher position, and then returns the solder sleeve pinchers to the first pincher position to again receive another portion of the wire. As such, the solder sleeve pinchers pulls at least a portion of the wire from the wire transport.

In block 2306, the solder sleeve pinchers holds and/or receives the electrical component (e.g., solder sleeve). In certain examples, pincher sensors and/or a controller are configured to determine that the solder sleeve pinchers are holding the wire when they are stopped (e.g., bottomed against the wire) while rotated at a first angle, but configured to determine that the solder sleeve pinchers are holding the electrical component when they are stopped while rotated at a second angle.

In block 2308, after determining that the solder sleeve pinchers are holding the electrical component, the solder sleeve pinchers moves the electrical component. In certain examples, the solder sleeve pinchers moves the electrical component to the third pincher position.

In block 2310, after the electrical component has been moved to the third pincher position, the solder sleeve pinchers releases the electrical component. The electrical component may, thus, be moved into a position suitable for processing. In certain such examples, the wire transport may then move the wire to a further wire processing station for processing.

Examples described above illustrate but do not limit the invention. It should also be understood that numerous modifications and variations are possible in accordance with the principles of the present invention. Accordingly, the scope of the invention is defined only by the following claims.

What is claimed is:

1. An apparatus for use in manufacturing an assembly from at least two components comprising a first component and a second component, wherein the first component is a wire, the apparatus comprising:
a body;
a wire channel disposed within the body, comprising a wire channel entry and a wire channel exit, and configured to receive the wire and the second component to be assembled with the wire in forming the assembly; and
one or more fluid guides disposed within the body, fluidically connected to the wire channel, and comprising a guide entry, a guide fluid channel, and a guide exit, wherein:
the guide entry is configured to receive a fluid from a fluid source,
the guide exit is configured to flow the fluid into the wire channel for the fluid to move the second component along a wire length in the wire channel in a predetermined longitudinal direction along the wire length, the second component positioned at least partially in the wire channel and coupled to the wire, the second component being coupled to the wire while being moved relative to the wire between ends of the wire to change the wire length between the second component and a predefined point of the wire inside the wire channel, and
the guide fluid channel fluidically connects the guide entry to the guide exit.

2. The apparatus of claim 1, wherein:
the second component is spaced from the ends of the wire while being moved between the ends of the wire; and
at least one of the fluid guides comprises a plurality of guide exits and one or more guide fluid channels, and each guide exit fluidically connects the wire channel to at least one of the guide fluid channels.

3. The apparatus of claim 1, wherein:
the one or more fluid guides comprise a first fluid guide and a second fluid guide;
each of the first fluid guide and the second fluid guide is disposed within the body, fluidically connected to the wire channel, and comprises a guide entry, a guide fluid channel, and a guide exit; and
the guide exit of the first fluid guide is disposed at a first point along a length of the wire channel and the guide exit of the second fluid guide is disposed at a second point along the length of the wire channel.

4. The apparatus of claim 3, further comprising a connector guide connecting, at least, the guide fluid channels of the first fluid guide and the second fluid guide.

5. The apparatus of claim 3, wherein at least one of the guide exits of the first fluid guide or the second fluid guide is configured to flow the fluid into the wire channel at an angle to an axis of the wire channel.

6. The apparatus of claim 1, wherein the one or more fluid guides comprise a substantially smooth cross-sectional profile along a fluid flow direction of the fluid guides.

7. The apparatus of claim 1, wherein the wire channel comprises a first channel section and a second channel section, wherein the first channel section comprises a first cross-sectional area and the second channel section comprises a second cross-sectional area, and wherein the first cross-sectional area is different than the second cross-sectional area.

8. The apparatus of claim 7, wherein the one or more fluid guides comprises a first fluid guide and a second fluid guide, and wherein the guide exit of the first fluid guide is disposed at least partially within the first channel section and the guide exit of the second fluid guide is disposed at least partially within the second channel section.

9. The apparatus of claim 1, wherein the body is comprised of a first body section and a second body section configured to be coupled to the first body section, the first body section being a mirror of the second body section.

10. The apparatus of claim 1, wherein the wire channel exit comprises a first section and a second section disposed at a mouth of the wire channel exit and wherein a cross-sectional area of the second section is less than a cross-sectional area of the first section.

11. The apparatus of claim 10, wherein the first section smoothly tapers to the second section.

12. The apparatus of claim 1, wherein the apparatus is configured to hold at least a portion of the wire in a predetermined position when flowing the fluid to move the second component; and
the guide entry comprises a fluid source receiver configured to couple to the fluid source to receive the fluid.

13. The apparatus of claim 12, wherein the fluid source receiver is configured to receive a plurality of different sized fittings of the fluid source.

14. A system comprising the apparatus of claim 1, wherein the apparatus is an electrical component delivery device, and wherein the system further comprises each said fluid source.

15. The system of claim 14, further comprising:
a first wire processing station comprising the electrical component delivery device;
a second wire processing station; and
a wire carrier configured to move between, at least, a first position proximate to the first wire processing station and a second position proximate to the second wire processing station.

16. A wire processing method for use in manufacturing an assembly from at least two components comprising a first component and a second component, wherein the first component is a wire, the method comprising:
receiving the wire, and the second component to be assembled with the wire in forming the assembly, with a wire channel disposed within a body and comprising a wire channel entry and a wire channel exit; and
flowing fluid through one or more fluid guides to cause the fluid to move the second component along a wire length in the wire channel in the predetermined longitudinal direction along the wire length, the second component positioned at least partially in the wire channel and coupled to the wire, the second component being moved relative to the wire, wherein:
the one or more fluid guides are disposed within the body, are fluidically connected to the wire channel, and comprise a guide entry, a guide fluid channel, and a guide exit, wherein:
the guide entry receives the fluid from at least one said fluid source,
the guide exit flows the fluid into the wire channel to move the second component along the wire length in the wire channel in the predetermined longitudinal direction along the wire length, the second component positioned at least partially in the wire channel and coupled to the wire, the second component being coupled to the wire while being moved relative to the wire between ends of the wire to change the wire length between the second component and a predefined point of the wire inside the wire channel, and
the guide fluid channel fluidically connects the guide entry to the guide exit.

17. The method of claim 16, wherein the second component is a solder sleeve.

18. The method of claim 17, further comprising:
after said moving the second component, automatically performing operations of:
stripping a wire portion, positioning the solder sleeve adjacent to the stripped wire portion, and soldering the solder sleeve to the stripped wire portion.

19. The method of claim 16, wherein:
the second component is spaced from the ends of the wire while being moved between the ends of the wire; and
the second component is an electrical component.

20. The method of claim 19, further comprising:
after said moving the second component, automatically performing operations of:
stripping a wire portion, positioning the second component adjacent to the stripped wire portion, and soldering the second component to the stripped wire portion.

21. An apparatus comprising:
a body;
a wire channel disposed within the body, comprising a wire channel entry and a wire channel exit, and configured to receive a wire; and
one or more fluid guides disposed within the body, fluidically connected to the wire channel, and comprising a guide entry, a guide fluid channel, and a guide exit, wherein:
the guide entry is configured to receive a fluid from a fluid source,
the guide exit is configured to flow the fluid into the wire channel for the fluid to move, along a wire length in the wire channel in a predetermined longitudinal direction along the wire length, a component positioned at least partially in the wire channel and coupled to the wire, the component being moved relative to the wire, and
the guide fluid channel fluidically connects the guide entry to the guide exit;
wherein the guide entry comprises a fluid source receiver configured to couple to the fluid source to receive the fluid, and
the second component is a solder sleeve.

22. The apparatus of claim 21, further comprising a bottoming feature configured to stop the solder sleeve in a predetermined position on the wire.

23. The apparatus of claim 21, wherein the solder sleeve has been threaded onto the wire.

24. The apparatus of claim 23, wherein the wire is insulated, and the apparatus is further configured, after said moving the second component, to strip a wire portion, position the solder sleeve adjacent to the stripped wire portion, and solder the solder sleeve to the stripped wire portion.

25. An apparatus for use in manufacturing an assembly from at least two components comprising a first component and a second component, wherein the first component is a wire, the apparatus comprising:
a body;
a wire channel disposed within the body, comprising a wire channel entry and a wire channel exit, and configured to receive the wire and the second component to be assembled with the wire in forming the assembly; and
one or more fluid guides disposed within the body, fluidically connected to the wire channel, and comprising a guide entry, a guide fluid channel, and a guide exit, wherein:

the guide entry is configured to receive a fluid from a fluid source, the guide exit is configured to flow the fluid into the wire channel for the fluid to move the second component along a wire length in the wire channel in a predetermined longitudinal direction along the wire length, the second component positioned at least partially in the wire channel and coupled to the wire, the second component being moved relative to the wire, and the guide fluid channel fluidically connects the guide entry to the guide exit;

wherein the guide entry comprises a fluid source receiver configured to couple to the fluid source to receive the fluid, and the apparatus comprises one or more stations configured, after the second component has been moved in said moving the second component, to strip a wire portion, position the second component adjacent to the stripped wire portion, and solder the second component to the stripped wire portion.

\* \* \* \* \*